(12) United States Patent
Jeong et al.

(10) Patent No.: US 11,060,904 B2
(45) Date of Patent: Jul. 13, 2021

(54) ELECTRONIC DEVICE AND ULTRAVIOLET LIGHT MEASURING METHOD THEREFOR

(71) Applicant: Samsung Electronics Co., Ltd., Gyeonggi-do (KR)

(72) Inventors: In-Jo Jeong, Gyeonggi-do (KR); Jung-Su Ha, Gyeonggi-do (KR); Haebahremahram Suh, Gyeonggi-do (KR); Jae-Bong Chun, Gyeonggi-do (KR)

(73) Assignee: Samsung Electronics Co., Ltd

( * ) Notice: Subject to any disclaimer, the term of this patent is extended or adjusted under 35 U.S.C. 154(b) by 76 days.

(21) Appl. No.: 16/480,150

(22) PCT Filed: Jan. 8, 2018

(86) PCT No.: PCT/KR2018/000348
§ 371 (c)(1),
(2) Date: Jul. 23, 2019

(87) PCT Pub. No.: WO2018/139781
PCT Pub. Date: Aug. 2, 2018

(65) Prior Publication Data
US 2019/0346306 A1    Nov. 14, 2019

(30) Foreign Application Priority Data
Jan. 26, 2017    (KR) .................. 10-2017-0012828

(51) Int. Cl.
*G01J 1/42*    (2006.01)
*G02B 5/30*    (2006.01)
(Continued)

(52) U.S. Cl.
CPC .............. *G01J 1/4228* (2013.01); *G01J 1/42* (2013.01); *G02B 5/30* (2013.01);
(Continued)

(58) Field of Classification Search
CPC .......... G01J 1/0429; G01J 1/0492; G01J 1/42; G01J 1/4228; G01J 1/429; G01J 1/44;
(Continued)

(56) References Cited

U.S. PATENT DOCUMENTS

| 4,554,587 A | 11/1985 | Ool et al. |
| 5,555,069 A | 9/1996 | Albrecht et al. |

(Continued)

FOREIGN PATENT DOCUMENTS

| CN | 101246297 | 8/2008 |
| JP | 2007150924 | 6/2007 |

(Continued)

OTHER PUBLICATIONS

PCT/ISA/210 Search Report issued on PCT/KR2018/000348, pp. 5.
PCT/ISA/237 Written Opinion issued on PCT/KR2018/000348, pp. 6.

*Primary Examiner* — Mark R Gaworecki
(74) *Attorney, Agent, or Firm* — The Farrell Law Firm, P.C.

(57) ABSTRACT

The present invention relates to an electronic device and a method for measuring ultraviolet light by using an electronic device including a camera. The electronic device according to various embodiments of the present invention comprises: a display; an image sensor for acquiring an image by using light including a first wavelength band or a second wavelength band; and a processor, wherein the processor can be set so as to compare a first image acquired using the light of the first wavelength band with a second image acquired using the light of the second wavelength band, acquire, on the basis of the comparison result, information on ultraviolet reflectance for at least a part of at least one subject included in the first image or the second image, and display at least a part of the acquired information on the ultraviolet reflectance by using the display.

20 Claims, 15 Drawing Sheets

(51) Int. Cl.
*G01J 1/02* (2006.01)
*G09G 3/36* (2006.01)
*H01L 51/50* (2006.01)

(52) U.S. Cl.
CPC ........ *G01J 2001/0257* (2013.01); *G09G 3/36* (2013.01); *H01L 51/50* (2013.01)

(58) Field of Classification Search
CPC ........ G01J 2001/0257; G01J 2001/446; G02B 5/30; G02B 5/3033; G02B 27/288; G02F 1/15; G02F 2201/083; G02F 2201/086; G02F 2203/055; G09G 3/36; H01L 27/3234; H01L 51/50
See application file for complete search history.

(56) References Cited

U.S. PATENT DOCUMENTS

| | | | |
|---|---|---|---|
| 2009/0268031 A1 | 10/2009 | Honma et al. | |
| 2015/0338272 A1* | 11/2015 | Rastegar | G06T 7/90 250/372 |
| 2016/0048954 A1 | 2/2016 | Cho et al. | |

FOREIGN PATENT DOCUMENTS

| | | |
|---|---|---|
| JP | 2016071310 | 5/2016 |
| JP | 2016158144 | 9/2016 |
| KR | 1020050028726 | 3/2005 |
| KR | 1020060059045 | 6/2006 |
| KR | 1020070052608 | 5/2007 |
| KR | 1020150070492 | 6/2015 |
| KR | 1020160021633 | 2/2016 |

\* cited by examiner

ELECTRONIC DEVICE AND ULTRAVIOLET LIGHT MEASURING METHOD THEREFOR

PRIORITY

This application is a National Phase Entry of International Application No. PCT/KR2018/000348, which was filed on Jan. 8, 2018, and claims priority to Korean Patent Application No. 10-2017-0012828, which was filed on Jan. 26, 2017, the content of each of which is incorporated herein by reference.

TECHNICAL FIELD

The disclosure generally relates to a method and an electronic device for measuring ultraviolet rays through at least one camera module.

BACKGROUND ART

Ultraviolet rays are a general term for a wide band of electromagnetic waves having wavelengths ranging from about 10 to 380 nm, and are classified into ultraviolet ray A (320 to 380 nm), ultraviolet ray B (280 to 320 nm), and ultraviolet ray C (100 to 280 nm). Ultraviolet rays activate vitamin D, help build strong bones, and have a sterilizing effect to kill colon bacilli, diphtheria bacilli, dysentery bacilli, etc. and thus can be used as a disinfecting and sterilizing method for food hygiene.

On the other hand, if skin is exposed to ultraviolet rays for a long time, various negative consequences may result. For example, ultraviolet rays are known to cause freckles, skin aging, skin cancer, and sunlight allergies. Particularly, ultraviolet A radiation may penetrate deeply through thick skin to make the skin tone dark and cause wrinkles and ultraviolet B radiation may mainly act on the skin surface to cause sunburn if the skin is overexposed. Moreover, if the skin is repeatedly exposed to ultraviolet B radiation, the possibility of skin cancer increases.

Recently, various methods of acquiring information on ultraviolet rays, which are harmful to the human body, and providing users of electronic devices with the acquired information have been developed. In general, such information on ultraviolet rays may be acquired through an ultraviolet measurement sensor within the electronic device or may be received from a public institution, and the electronic device may provide the user with the acquired information.

For example, the conventional electronic device may acquire information on ultraviolet rays through a photodiode included in the electronic device. The photodiode is a semiconductor device capable of converting an optical signal into an electrical signal. When incident sunlight is radiated to the surface of the photodiode, an electron and a hole having a positive charge are generated, and thus current flows. The amount of light is measured based on the magnitude of the voltage generated at this time. Particularly, the photodiode for measuring the magnitude of ultraviolet rays is a photodiode capable of detecting only ultraviolet rays, among the wide band of radiation emitted by the sun, by adjusting an energy band gap, and is manufactured using materials such as silicon carbide (SiC) or silicon dioxide (SiO2).

Further, the conventional electronic device may acquire information related to ultraviolet rays by receiving ultraviolet radiation information provided from a public institution. A weather center or various companies for providing weather information provide information related to ultraviolet rays as well as environmental information, such as information on fine dust and ozone, through sensors installed in multiple locations.

As described above, the conventional electronic device acquires ultraviolet radiation information through a method of directly measuring ultraviolet rays through an ultraviolet measurement sensor separately included in the electronic device or receiving relevant information from the outside.

DETAILED DESCRIPTION OF THE INVENTION

Technical Problem

Meanwhile, it has been difficult to acquire, through a conventional electronic device, accurate information on ultraviolet rays currently influencing the user of an electronic device. For example, ultraviolet radiation information acquired through a photodiode of the electronic device is influenced by the angle at which sunlight is incident on the electronic device and the time for which the electronic device is exposed to sunlight. In order to accurately measure the amount of ultraviolet rays using the photodiode, it is required that the angle of sunlight incident on the electronic device be 90 degrees. However, it is not easy for the user to make the sunlight incident on the electronic device at an angle of 90 degrees, and moreover, because the user must not move for a predetermined time in the state in which the is sunlight incident on the electronic device at an angle of 90 degrees, it is difficult to accurately measure the amount of ultraviolet rays.

Further, ultraviolet radiation information acquired from the outside, such as public institutions, is information having high measurement accuracy but is measured at a location distant from the user of the electronic device, so the ultraviolet radiation information is problematic in that the information does not reflect the actual ultraviolet radiation incident on the user.

In addition, everybody is influenced by ultraviolet rays to a different level, and thus it is difficult to acquire ultraviolet radiation information reflecting the state of an individual user through the conventional electronic device. For example, the rate of absorption of ultraviolet rays may vary depending on the skin tone of an individual user. The darker the skin tone the more melanin pigment, which generally acts as sunscreen, the skin contains. Accordingly, as the skin tone is darker, the ultraviolet radiation absorption rate may be lower. In other words, through the conventional electronic device, ultraviolet radiation information of the environment around the user may be acquired, but ultraviolet radiation information that takes into account the state of the individual user cannot be provided to the user.

The disclosure has been made to solve the above problems, and relates to a method of identifying the quantity of ultraviolet rays absorbed into the user's skin and the influence the ultraviolet rays have, and to an electronic device for performing the method. An electronic device according to an embodiment of the disclosure is capable of measuring the amount of ultraviolet rays reflected from a user's body, particularly the face, and providing ultraviolet radiation information to the user on the basis of the measured amount of ultraviolet rays. Further, the electronic device according to an embodiment of the disclosure is capable of providing information such as the location to which the sunscreen is applied to the user on the basis of ultraviolet radiation distribution on the user's face.

Technical Solution

An electronic device according to various embodiments of the disclosure includes: a display; an image sensor configured to acquire an image using light including a first wavelength band or a second wavelength band; and a processor, wherein the processor is configured to compare a first image acquired using the light of the first wavelength band and a second image acquired using the light of the second wavelength band, acquire information on ultraviolet reflectance of at least a portion of at least one subject included in the first image or the second image, based on a result of the comparison, and display at least some of the acquired information on the ultraviolet reflectance on the display.

A method of acquiring an image through an electronic device including an image sensor includes: comparing a first image, acquired using light of a first wavelength band and a second image acquired using light of a second wavelength band; acquiring information on ultraviolet reflectance of at least a portion of at least one subject included in the first image or the second image, based on a result of the comparison; and displaying at least some of the acquired information on the ultraviolet reflectance on a display.

Advantageous Effects

According to various embodiments of the disclosure, an electronic device is capable of providing ultraviolet radiation distribution that directly influences a user's skin in the form of an image. The user of the electronic device can determine an ultraviolet exposure area and an ultraviolet exposure level on the basis of information on ultraviolet radiation, which influences the skin.

According to another embodiment, the electronic device is capable of providing the user with information on an area requiring additional application of sunscreen, among areas of skin of a user to which sunscreen is applied.

MODE FOR CARRYING OUT THE INVENTION

Figure 1:
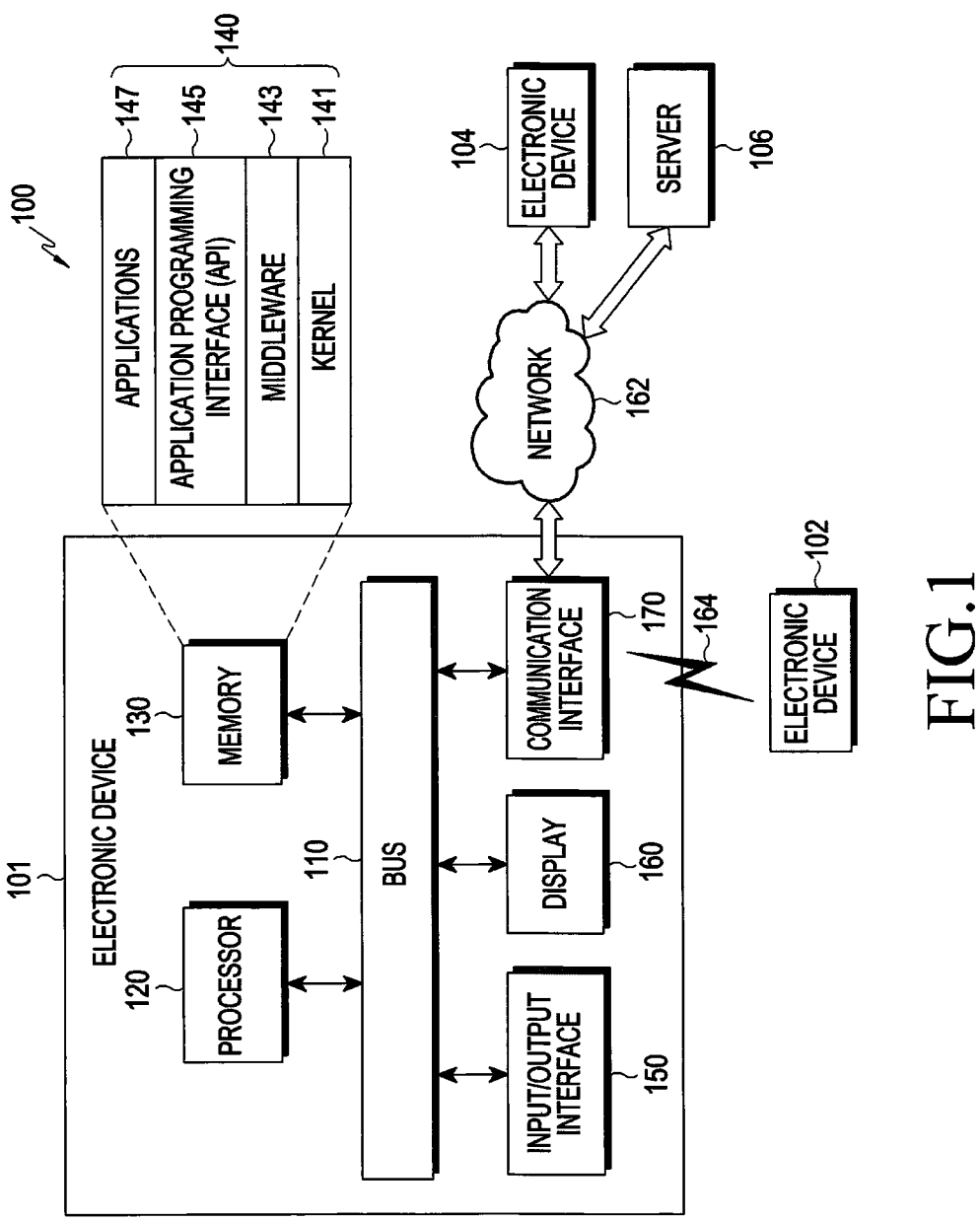
FIG. 1 illustrates a network environment including an electronic device according to an embodiment of the disclosure.

Hereinafter, various embodiments of the disclosure will be described with reference to the accompanying drawings. The embodiments and the terms used therein are not intended to limit the technology disclosed herein to specific forms, and should be understood to include various modifications, equivalents, and/or alternatives to the corresponding embodiments. In describing the drawings, similar reference numerals may be used to designate similar constituent elements. A singular expression may include a plural expression unless they are definitely different in a context. As used herein, the expression "A or B" or "at least one of A and/or B" may include all possible combinations of items enumerated together. The expression "a first", "a second", "the first", or "the second" may modify various components regardless of the order and/or the importance, and is used merely to distinguish one element from any other element without limiting the corresponding elements. When an element (e.g., first element) is referred to as being "(functionally or communicatively) connected," or "directly coupled" to another element (second element), the element may be connected directly to the another element or connected to the another element through yet another element (e.g., third element).

The expression "configured to" as used in various embodiments of the disclosure may be interchangeably used with, for example, "suitable for", "having the capacity to", "designed to", "adapted to", "made to", or "capable of" in terms of hardware or software, according to circumstances. Alternatively, in some situations, the expression "device configured to" may mean that the device, together with other devices or components, "is able to". For example, the phrase "processor adapted (or configured) to perform A, B, and C" may mean a dedicated processor (e.g., embedded processor) only for performing the corresponding operations or a generic-purpose processor (e.g., Central Processing Unit (CPU) or Application Processor (AP)) that can perform the corresponding operations by executing one or more software programs stored in a memory device.

An electronic device according to various embodiments of the disclosure may include at least one of, for example, a smart phone, a tablet Personal Computer (PC), a mobile phone, a video phone, an electronic book reader (e-book reader), a desktop PC, a laptop PC, a netbook computer, a workstation, a server, a Personal Digital Assistant (PDA), a Portable Multimedia Player (PMP), an MPEG-1 audio layer-3 (MP3) player, a mobile medical device, a camera, and a wearable device. According to various embodiments, the wearable device may include at least one of an accessory type (e.g., a watch, a ring, a bracelet, an anklet, a necklace, a glasses, a contact lens, or a Head-Mounted Device (HMD)), a fabric or clothing integrated type (e.g., an electronic clothing), a body-mounted type (e.g., a skin pad, or tattoo), and a bio-implantable type (e.g., an implantable circuit). In some embodiments, the electronic device may include at least one of, for example, a television, a Digital Video Disk (DVD) player, an audio player, a refrigerator, an air conditioner, a vacuum cleaner, an oven, a microwave oven, a washing machine, an air cleaner, a set-top box, a home automation control panel, a security control panel, a TV box (e.g., Samsung HomeSync™, Apple TV™, or Google TV™), a game console (e.g., Xbox™ and PlayStation™), an electronic dictionary, an electronic key, a camcorder, and an electronic photo frame.

In other embodiments, the electronic device may include at least one of various medical devices (e.g., various portable medical measuring devices (a blood glucose monitoring device, a heart rate monitoring device, a blood pressure measuring device, a body temperature measuring device, etc.), a Magnetic Resonance Angiography (MRA), a Magnetic Resonance Imaging (MRI), a Computed Tomography (CT) machine, and an ultrasonic machine), a navigation device, a Global Positioning System (GPS) receiver, an Event Data Recorder (EDR), a Flight Data Recorder (FDR), a Vehicle Infotainment Devices, an electronic devices for a ship (e.g., a navigation device for a ship, and a gyrocompass), avionics, security devices, an automotive head unit, a robot for home or industry, an Automatic Teller Machine (ATM) in banks, a Point Of Sale (POS) in a shop, or Internet device of things (e.g., a light bulb, various sensors, electric or gas meter, a sprinkler device, a fire alarm, a thermostat, a streetlamp, a toaster, a sporting goods, a hot water tank, a heater, a boiler, etc.). According to some embodiments, an electronic device may include at least one of a part of furniture or a building/structure, an electronic board, an electronic signature receiving device, a projector, and various types of measuring instruments (e.g., a water meter, an electric meter, a gas meter, a radio wave meter, and the like). In various embodiments, the electronic device may be flexible, or may be a combination of one or more of the aforementioned various devices. The electronic device according to embodiments of the disclosure is not limited to the above-described devices. In the disclosure, the term "user" may indicate a person using an electronic device or a device (e.g., an artificial intelligence electronic device) using an electronic device.

Referring to FIG. 1, an electronic device 101 within a network environment 100 according to various embodiments will be described. The electronic device 101 may include a bus 110, a processor 120, a memory 130, an input/output interface 150, a display 160, and a communication interface 170. In some embodiments, the electronic device 101 may omit at least one of the elements, or may further include other elements. The bus 110 may include, for example, a circuit that interconnects the elements 110 to 170 and transmits communication (for example, control messages or data) between the elements. The processor 120 may include one or more of a central processing unit, an application processor, and a communication processor (CP). The processor 120 may carry out, for example, operations or data processing relating to the control and/or communication of at least one other element of the electronic device 101.

The memory 130 may include volatile and/or nonvolatile memory. The memory 130 may store, for example, instructions or data relevant to at least one other element of the electronic device 101. According to an embodiment, the memory 130 may store software and/or a program 140. The program 140 may include, for example, a kernel 141, middleware 143, an Application Programming Interface (API) 145, and/or applications (or "apps") 147. At least some of the kernel 141, the middleware 143, and the API 145 may be referred to as an operating system. The kernel 141 may control or manage system resources (for example, the bus 110, the processor 120, or the memory 130) used for executing an operation or function implemented by other programs (for example, the middleware 143, the API 145, or the application 147). Furthermore, the kernel 141 may provide an interface through which the middleware 143, the API 145, or the applications 147 may access the individual elements of the electronic device 101 to control or manage the system resources.

The middleware 143 may function as, for example, an intermediary for allowing the API 145 or the applications 147 to communicate with the kernel 141 to exchange data. Furthermore, the middleware 143 may process one or more task requests, which are received from the applications 147, according to priorities thereof. For example, the middleware 143 may assign priorities for using the system resources (for example, the bus 110, the processor 120, the memory 130, or the like) of the electronic device 101 to one or more of the applications 147, and may process the one or more task requests. The API 145 is an interface through which the applications 147 control functions provided from the kernel 141 or the middleware 143, and may include, for example, at least one interface or function (for example, instruction) for file control, window control, image processing, or text control. For example, the input/output interface 150 may forward instructions or data, input from a user or an external device, to other element(s) of the electronic device 101, or may output instructions or data, received from the other element(s) of the electronic device 101, to the user or the external device.

The display 160 may include, for example, a Liquid Crystal Display (LCD), a Light-Emitting Diode (LED) display, an Organic Light-Emitting Diode (OLED) display, a Micro Electro Mechanical System (MEMS) display, or an electronic paper display. The display 160 may display, for example, various types of content (for example, text, images, videos, icons, and/or symbols) for a user. The display 160 may include a touch screen and may receive, for example, a touch, gesture, proximity, or hovering input using an electronic pen or the user's body part.

The communication interface 170 may establish, for example, communication between the electronic device 101 and an external device (for example, a first external electronic device 102, a second external electronic device 104, or a server 106). For example, the communication interface 170 may be connected to a network 162 through wireless or wired communication in order to communicate with the external device (for example, the second external electronic device 104 or the server 106).

The wireless communication may include, for example, cellular communication that uses at least one of LTE, LTE-Advanced (LTE-A), code-division multiple access (CDMA), wideband CDMA (WCDMA), universal mobile telecommunications system (UMTS), wireless broadband (WiBro), global system for mobile communications (GSM), or the like. According to an embodiment, like an element 164 illustrated in FIG. 1, the wireless communication may include, for example, at least one of Wi-Fi, Li-Fi (Light Fidelity), Bluetooth, Bluetooth Low Energy (BLE), ZigBee, Near Field Communication (NFC), magnetic secure transmission, Radio Frequency (RF), and Body Area Network (BAN). According to an embodiment, the wired communication may include GNSS. The GNSS may be, for example, a global positioning system (GPS), a global navigation satellite system (GLONASS), a BeiDou navigation satellite system (hereinafter, referred to as "BeiDou"), or Galileo (the European global satellite-based navigation system). Hereinafter, in this document, the term "GPS" may be interchangeable with the term "GNSS". The wired communication may include, for example, at least one of a Universal Serial Bus (USB), a High-Definition Multimedia Interface (HDMI), Recommended Standard 232 (RS-232), power line communication, a Plain Old Telephone Service (POTS), and the like. The network 162 may include a telecommunications network, for example, at least one of a computer network (for example, a LAN or a WAN), the Internet, and a telephone network.

Each of the first and second external electronic devices 102 and 104 may be of a type the same as or different from that of the electronic device 101. According to various embodiments, all or some of the operations executed in the electronic device 101 may be executed in another electronic device or a plurality of electronic devices (for example, the electronic devices 102 and 104 or the server 106). According to an embodiment, when the electronic device 101 has to perform some functions or services automatically or in response to a request, the electronic device 101 may make a request for performing at least some functions relating thereto to another device (for example, the electronic device 102 or 104 or the server 106) additionally or instead of performing the functions or services by itself. Another electronic device (for example, the electronic device 102 or 104, or the server 106) may execute the requested functions or the additional functions, and may deliver the result thereof to the electronic device 101. The electronic device 101 may provide the received result as it is, or may perform additional processing to provide the requested functions or services. To this end, for example, cloud-computing, distributed-computing, or client-server-computing technology may be used.

Figure 2:
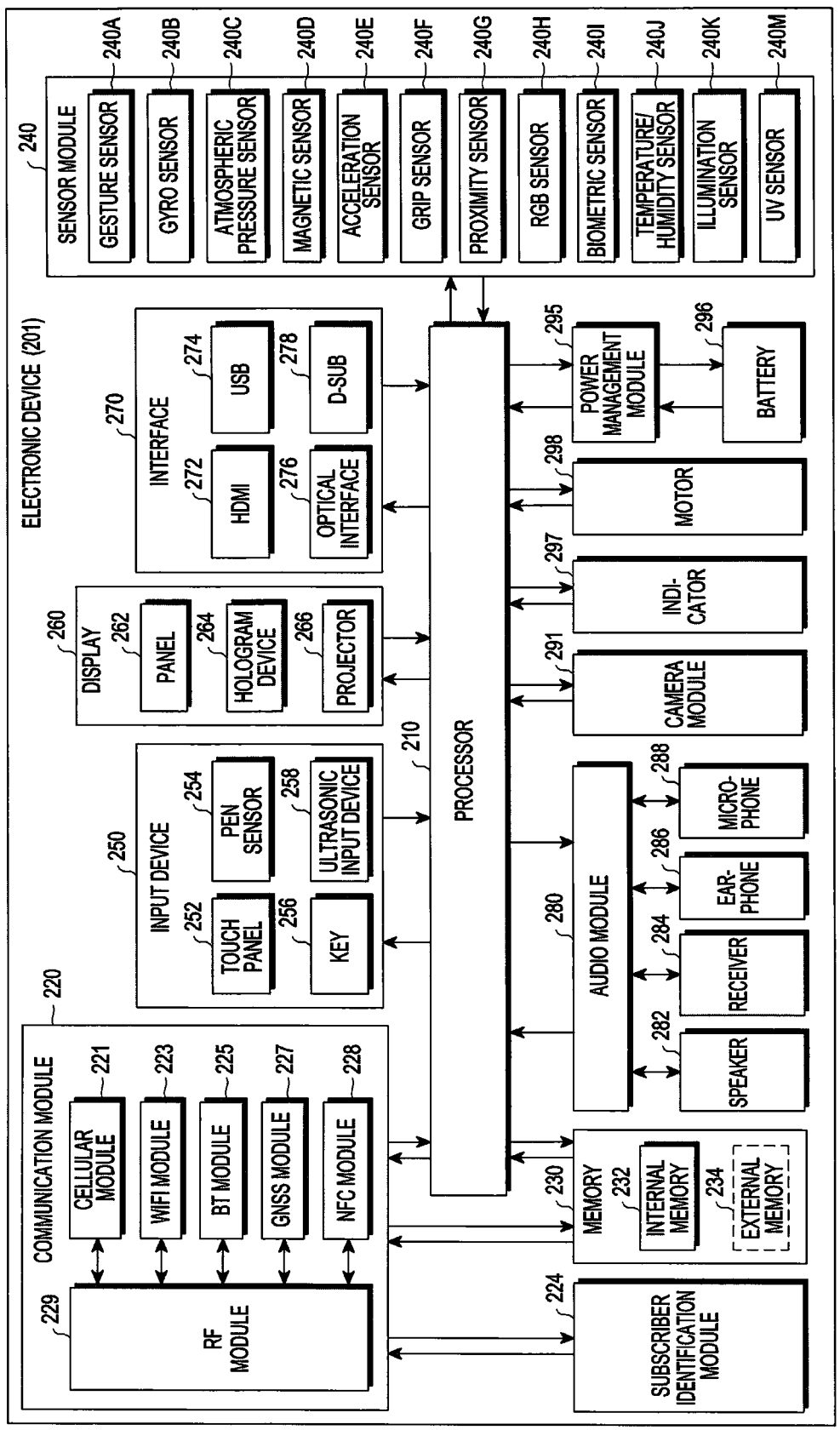
FIG. 2 is a block diagram of an electronic device according to various embodiments of the disclosure.

FIG. 2 is a block diagram of an electronic device 201 according to various embodiments. The electronic device 201 may include, for example, the whole or part of the electronic device 101 illustrated in FIG. 1. The electronic device 201 may include at least one processor 210 (for example, an AP), a communication module 220, a subscriber identification module 224, a memory 230, a sensor module 240, an input device 250, a display 260, an interface 270, an audio module 280, a camera module 291, a power management module 295, a battery 296, an indicator 297, and a motor 298. The processor 210 may control a plurality of hardware or software elements connected thereto and may perform various data processing and operations by driving an operating system or an application. The processor 210 may be implemented by, for example, a System on Chip (SoC). According to an embodiment, the processor 210 may further include a graphic processing unit (GPU) and/or an image signal processor. The processor 210 may also include at least some of the elements illustrated in FIG. 2 (for example, a cellular module 221). The processor 210 may load, in volatile memory, instructions or data received from at least one of the other elements (for example, nonvolatile memory), process the loaded instructions or data, and store the resultant data in the nonvolatile memory.

The communication module 220 may have a configuration that is the same as, or similar to, that of the communication interface 170. The communication module 220 (for example, the communication interface 170) may include, for example, a cellular module 221, a Wi-Fi module 223, a Bluetooth module 225, a GNSS module 227, an NFC module 228, and an RF module 229. The cellular module 221 may provide, for example, a voice call, a video call, a text message service, an Internet service, or the like through a communication network. According to an embodiment, the cellular module 221 may identify and authenticate the electronic device 201 within a communication network using the subscriber identification module 224 (for example, a SIM card). According to an embodiment, the cellular module 221 may perform at least some of the functions that the processor 210 may provide. According to an embodiment, the cellular module 221 may include a communication processor (CP). In some embodiments, at least some (for example, two or more) of the cellular module 221, the Wi-Fi module 223, the Bluetooth module 225, the GNSS module 227, and the NFC module 228 may be included in a single Integrated Chip (IC) or IC package. The RF module 229 may transmit/receive, for example, a communication signal (for example, an RF signal). The RF module 229 may include, for example, a transceiver, a power amp module (PAM), a frequency filter, a low-noise amplifier (LNA), an antenna, or the like. According to another embodiment, at least one of the cellular module 221, the Wi-Fi module 223, the BT module 225, the GNSS module 227, and the NFC module 228 may transmit/receive an RF signal through a separate RF module. The subscriber identification module 224 may include, for example, a card that includes a subscriber identity module and/or an embedded SIM, and may contain unique identification information (for example, an Integrated Circuit Card Identifier (ICCID)) or subscriber information (for example, an International Mobile Subscriber Identity (IMSI)).

The memory 230 (for example, the memory 130) may include, for example, an internal memory 232 or an external memory 234. The internal memory 232 may include, for example, at least one of a volatile memory (for example, a DRAM, an SRAM, an SDRAM, or the like) and a nonvolatile memory (for example, a One-Time Programmable ROM (OTPROM), a PROM, an EPROM, an EEPROM, a mask ROM, a flash ROM, a flash memory, a hard disc drive, or a Solid-State Drive (SSD)). The external memory 234 may include a flash drive, for example, a compact flash (CF), a secure digital (SD), a Micro-SD, a Mini-SD, an eXtreme digital (xD), a multi-media card (MMC), a memory stick, and the like. The external memory 234 may be functionally and/or physically connected to the electronic device 201 through any of various interfaces.

The sensor module 240 may measure, for example, a physical quantity or detect the operating state of the electronic device 201, and may convert the measured or detected information into an electrical signal. The sensor module 240 may include, for example, at least one of a gesture sensor 240A, a gyro sensor 240B, an atmospheric pressure sensor 240C, a magnetic sensor 240D, an acceleration sensor 240E, a grip sensor 240F, a proximity sensor 240G, a color sensor 240H (for example, a red, green, blue (RGB) sensor), a biometric sensor 240I, a temperature/humidity sensor 240J, an illumination sensor 240K, and an ultraviolet (UV) sensor 240M. Additionally or alternatively, the sensor module 240 may include, for example, an e-nose sensor, an electromyography (EMG) sensor, an electroencephalogram (EEG) sensor, an electrocardiogram (ECG) sensor, an infrared (IR) sensor, an iris sensor, and/or a fingerprint sensor. The sensor module 240 may further include a control circuit for controlling one or more sensors included therein. In some embodiments, the electronic device 201 may further include a processor configured to control the sensor module 240 as a part of or separately from the AP 210, and may control the sensor module 240 while the AP 210 is in a sleep state.

The input device 250 may include, for example, a touch panel 252, a (digital) pen sensor 254, a key 256, or an ultrasonic input device 258. The touch panel 252 may be, for example, at least one of a capacitive type, a resistive type, an infrared type, and an ultrasonic type. Furthermore, the touch panel 252 may further include a control circuit. The touch panel 252 may further include a tactile layer to provide a tactile reaction to a user. The (digital) pen sensor 254 may include, for example, a recognition sheet that is a part of, or separate from, the touch panel. The key 256 may include, for example, a physical button, an optical key, or a keypad. The ultrasonic input device 258 may detect ultrasonic waves, which are generated by an input tool, through a microphone (for example, a microphone 288) to identify data corresponding to the detected ultrasonic waves.

The display 260 (for example, the display 160) may include a panel 262, a hologram device 264, a projector 266, and/or a control circuit for controlling the same. The panel 262 may be implemented to be, for example, flexible, transparent, or wearable. The panel 262, together with the touch panel 252, may be configured as one or more modules. According to an embodiment, the panel 262 may include a pressure sensor (or a POS sensor) which may measure the strength of pressure of a user's touch. The pressure sensor may be implemented so as to be integrated with the touch panel 252, or may be implemented as one or more sensors separate from the touch panel 252. The hologram device 264 may show a three-dimensional image in the air using light interference. The projector 266 may display an-image by projecting light onto a screen. The screen may be located, for example, in the interior of, or on the exterior of, the electronic device 201. The interface 270 may include, for example, an HDMI 272, a USB 274, an optical interface 276, or a D-subminiature (D-sub) interface 278. The interface 270 may be included in, for example, the communication interface 170 illustrated in FIG. 1. Additionally or alternatively, the interface 270 may, for example, include a mobile high-definition link (MHL) interface, a secure digital (SD) card/multi-media card (MMC) interface, or an infrared data association (IrDA) standard interface.

The audio module 280 may convert, for example, sound into an electrical signal and vice versa. At least some elements of the audio module 280 may be included, for example, in the input/output interface 145 illustrated in FIG. 1. The audio module 280 may process sound information that is input or output through, for example, a speaker 282, a receiver 284, earphones 286, the microphone 288, and the like. The camera module 291 is a device that can take a still image and a moving image. According to an embodiment, the camera module 291 may include one or more image sensors (for example, a front sensor or a rear sensor), a lens, an image signal processor (ISP), or a flash (for example, an LED or xenon lamp). The power management module 295 may manage, for example, the power of the electronic device 201. According to an embodiment, the power management module 295 may include a power management integrated circuit (PMIC), a charger IC, or a battery or fuel gauge. The PMIC may use a wired and/or wireless charging method. Examples of the wireless charging method may include a magnetic resonance method, a magnetic induction method, an electromagnetic-wave method, and the like. Additional circuits (for example, a coil loop, a resonance circuit, a rectifier, and the like) for wireless charging may be further included. The battery gauge may measure, for example, the remaining charge of the battery 296 and a voltage, current, or temperature while charging. The battery 296 may include, for example, a rechargeable battery and/or a solar battery.

The indicator 297 may display a particular state, for example, a booting state, a message state, a charging state, or the like of the electronic device 201 or a part (for example, the processor 210) of the electronic device 201. The motor 298 may convert an electrical signal into a mechanical vibration and may generate a vibration, a haptic effect, or the like. The electronic device 201 may include a mobile TV support device (for example, a GPU) that can process media data according to a standard, such as digital multimedia broadcasting (DMB), digital video broadcasting (DVB), MediaFlo™, and the like. Each of the above-described component elements of hardware according to the disclosure may be configured with one or more components, and the names of the corresponding component elements may vary based on the type of electronic device. In various embodiments, an electronic device (for example, the electronic device 201) may omit some elements or may further include additional elements, or some of the elements of the electronic device may be combined with each other to configure one entity, in which case the electronic device may identically perform the functions of the corresponding elements prior to the combination.

An electronic device according to various embodiments of the disclosure may include a display (for example, the display 160 or 260), an image sensor (for example, the image sensor 291) for acquiring an image using light including a first wavelength band or a second wavelength band, and a processor (for example, the processor 120 or 210), wherein the processor is configured to compare a first image acquired using light of the first wavelength band and a second image acquired using light of the second wavelength band, acquire information on ultraviolet reflectance of at least a portion of at least one subject included in the first image or the second image on the basis of the result of the comparison, and display at least some of the acquired information on the ultraviolet reflectance on the display.

For the electronic device according to an embodiment of the disclosure, the first wavelength may include an infrared band, a visible light band, and an ultraviolet band, and the second wavelength band may include an infrared band or a visible light band (for example, only an infrared band, only a visible light band, or both an infrared band a visible light band).

For the electronic device according to an embodiment of the disclosure, the image sensor may include a first image sensor for acquiring an image using the light of the first wavelength band and a second image sensor for acquiring an image using the light of the second wavelength band.

The electronic device according to an embodiment of the disclosure may further include a filter for blocking light of at least a portion of the first wavelength band, and the processor may be configured to acquire the first image using the light of the first wavelength band after deactivating the filter, store the acquired first image in the memory of the electronic device, acquire the second image using the light of the second wavelength band from which the light of at least a portion of the first wavelength band is blocked after activating the filter, and compare the stored first image and the acquired second image.

For the electronic device according to an embodiment of the disclosure, the filter may include: a transparent member configured to form at least a portion of external surfaces of the filter; a transparent anode and a transparent cathode coated with an electrochromic material; and an electrolyte located inside the filter and between the transparent anode and the transparent cathode.

For the electronic device according to an embodiment of the disclosure, the filter may include: a first polarizing plate disposed on a first surface in a first direction on the external surfaces of the filter; a second polarizing plate having a polarizing axis orthogonal to a polarizing axis of the first polarizing plate and disposed on a second surface in a second direction opposite the first direction on the external surfaces of the filter; and a liquid crystal disposed between the first polarizing plate and the second polarizing plate.

For the electronic device according to an embodiment of the disclosure, the filter may include: a blocking plate configured to block the light of at least a portion of the first wavelength band; a flat plate including a hole through which the light of the first wavelength band passes; and an actuator configured to move the blocking plate in order to open/close at least one hole formed in the flat plate.

For the electronic device according to an embodiment of the disclosure, the processor may be configured to acquire a differential image using the first image and the second image and acquire information on the ultraviolet reflectance, based on the acquired differential image.

For the electronic device according to an embodiment of the disclosure, the processor may be configured to display the information on the ultraviolet reflectance acquired based on the differential image and at least a portion of the at least one subject.

Figure 3A:
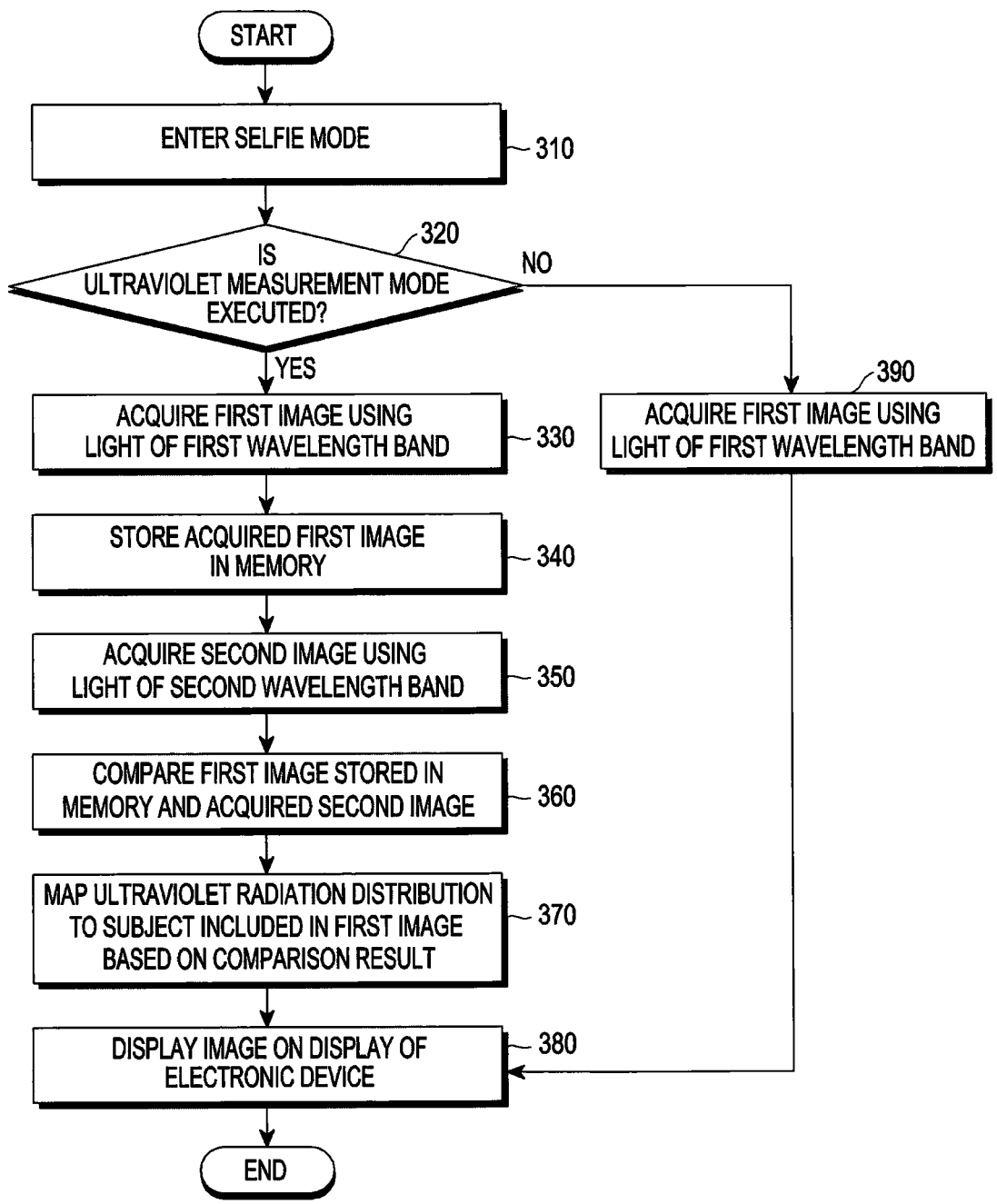
FIGS. 3A and 3B illustrate acquisition of ultraviolet radiation information through an electronic device according to various embodiments of the disclosure.
Figure 3B:
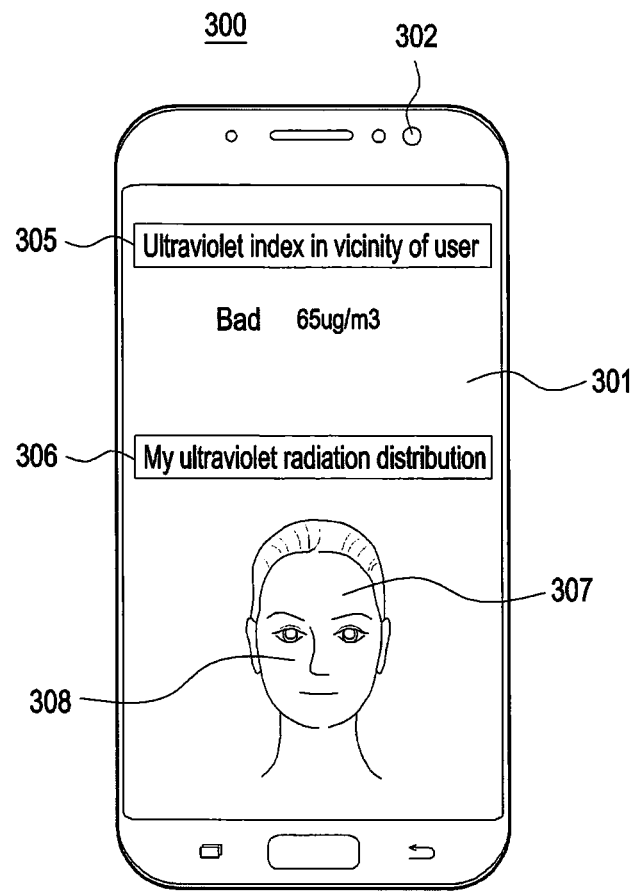

FIGS. 3A and 3B illustrate the acquisition of ultraviolet radiation information through an electronic device according to various embodiments of the disclosure, and FIG. 3A is a flowchart illustrating a process of acquiring ultraviolet radiation information through an electronic device according to various embodiments of the disclosure.

According to an embodiment of the disclosure, an electronic device (for example, the electronic device 101 or 201) may include at least one camera (for example, the camera module 291), a display (for example, the display 160 or 260), and a processor (for example, the processor 120 or 210).

In operation 310, the processor of the electronic device may determine whether a signal related to execution of a selfie mode is received. A selfie is an operation in which the user of the electronic device directly photographs himself/herself through a camera included in the electronic device or an image itself photographed by the user. When the signal related to the execution of the selfie mode is received, the processor of the electronic device may activate the camera of the electronic device. The processor of the electronic device may acquire at least one image through the activated camera and display a preview image corresponding to the acquired image through a display. For reference, when an image corresponding to at least one object is acquired through the camera of the electronic device, the preview image is an image displayed in real time on the display in response to the image acquisition. The preview image acquired through the camera may be displayed in real time on the display, and the user of the electronic device may easily take the selfie while watching the preview image displayed on the display. The processor, having verified entry into the selfie mode, may perform operation 320.

In operation 320, the processor of the electronic device may determine whether an ultraviolet measurement mode is executed. When it is determined that the ultraviolet measurement mode is executed, the processor of the electronic device may perform operation 330. When it is determined that the ultraviolet measurement mode is not executed, the processor of the electronic device may perform operation 390.

If it is determined that the ultraviolet measurement mode is executed, the processor of the electronic device may acquire a first image through light of a first wavelength band in operation 330. For example, the processor of the electronic device may acquire a first image including the light of the first wavelength band through at least one camera included in the electronic device. The first wavelength band may be a band including all wavelengths of an ultraviolet band (about 10 to 380 nm), a visible light band (about 380 to 770 nm), and an infrared band (about 770 nm or higher). Accordingly, the first image acquired through the light of the first wavelength band may be an image acquired through a general camera.

In operation 340, the processor of the electronic device may store the acquired first image in a memory (for example, the memory 130 or 230) of the electronic device. The memory of the electronic device in which the first image is stored may include volatile and/or nonvolatile memory.

In operation 350, the processor of the electronic device may acquire a second image through light of a second wavelength band. For example, the processor of the electronic device may acquire a second image including the light of the second wavelength band through at least one camera included in the electronic device. The second wavelength band may be a band including the wavelength of at least one of the visible light band (about 380 to 770 nm) and the infrared ray band (about 770 nm or higher). Accordingly, the second image acquired through the light of the second wavelength band may not include data which is based on light of the ultraviolet band.

According to an embodiment, the camera of the electronic device may include a filter for blocking the light of the ultraviolet band. The processor of the electronic device may deactivate the filter for blocking the light of the ultraviolet band in order to acquire the first image including the light of the first wavelength band. The deactivated filter cannot block the light of the ultraviolet band included in the first wavelength band, so that the processor of the electronic device may acquire the first image including the light of the first wavelength band through the camera. Alternatively, the processor of the electronic device may activate the filter for blocking the light of the ultraviolet band in order to acquire the second image including the light of the second wavelength band. The activated filter can block the light of the ultraviolet band included in the first wavelength band, so that the processor of the electronic device may acquire the second image including the light of the second wavelength band through the camera.

In operation 360, the processor of the electronic device may load the first image stored in the memory and then compare the first image with the second image. For example, the processor of the electronic device may acquire ultraviolet radiation information included in the first image by performing an operation of subtracting the second image from the first image. More specifically, since the first image is an image acquired on the basis of the light of the ultraviolet band, the visible light band, and the infrared ray band and the second image is an image acquired on the basis of the light of at least one of the visible light band and the infrared band, the processor of the electronic device may acquire ultraviolet radiation information by comparing the first image and the second image. Further, the processor of the electronic device may acquire a differential image between the first image and the second image using the first image and the second image and acquire ultraviolet radiation information using the acquired differential image.

According to an embodiment, information on ultraviolet reflectance may include the acquired ultraviolet radiation information. The information on the ultraviolet reflectance may include information on a value of at least one of a plurality of pixels included in the first image or the second image. The information on the ultraviolet reflectance may include information on relative reflectance between a plurality of pixels included in the first image or the second image. The information on the ultraviolet reflectance may include ultraviolet radiation distribution information on at least a portion of at least one subject (for example, a particular area or part of at least one subject) included in the first image or the second image. The information on the ultraviolet reflectance may include an image showing the ultraviolet radiation distribution state of at least a portion of at least one subject included in the first image or the second image.

The processor of the electronic device may acquire ultraviolet radiation information on the basis of data pre-stored in the memory (for example, the memory 130 or 230) of the electronic device or data received from the outside through a communication unit (for example, the communication interface 170 or the communication module 230) of the electronic device.

For example, the processor of the electronic device may acquire ultraviolet radiation information on the basis of user information (for example, user's body information or user's health state information) input in advance by the user of the electronic device. More specifically, the processor of the electronic device may acquire ultraviolet radiation information on the basis of data received from a health management application (for example, S-Health™).

For example, the processor of the electronic device may acquire ultraviolet radiation information on the basis of medical information related to the user of the electronic device (for example, medical records and medicine that the user has taken). More specifically, the processor of the electronic device may acquire ultraviolet radiation information on the basis of medical information pre-stored in the memory of the electronic device or medical information received from the outside through the communication unit of the electronic device. The medical information related to the user of the electronic device may include genetic information of the user. The processor of the electronic device may identify whether the user's skin is strongly or weakly resistant to ultraviolet rays through the genetic information of the user. The processor of the electronic device may acquire ultraviolet radiation information on the basis of the information identified through the genetic information of the user.

For example, after identifying the location of the electronic device, the processor of the electronic device may identify at least one piece of environmental information (for example, weather, ozone concentration, and ultraviolet index) corresponding to the location of the electronic device. The processor of the electronic device may acquire ultraviolet radiation information on the basis of at least one piece of identified environmental information.

For example, the processor of the electronic device may identify the skin tone or skin state of the user of the electronic device using at least one of the images stored in the memory of the electronic device and acquire ultraviolet radiation information on the basis of the identification result.

In operation 370, the processor of the electronic device may map ultraviolet radiation distribution to at least one subject included in the first image on the basis of the result of comparison between the first image and the second image. For example, the processor of the electronic device may acquire ultraviolet radiation distribution related to at least one subject included in the first image on the basis of the ultraviolet radiation information acquired in operation 360. The processor of the electronic device may map the acquired ultraviolet radiation distribution to at least one subject included in the first image. Further, the processor of the electronic device may identify information on ultraviolet radiation that influences at least one subject included in the first image and generate an image related to the identified ultraviolet radiation distribution.

In operation 380, the processor of the electronic device may display the image related to the ultraviolet radiation distribution on the display. For example, the processor of the electronic device may additionally perform graphical processing such as color, brightness, and chroma processing on the image to which the ultraviolet radiation distribution is mapped. The processor of the electronic device may display the image having undergone the graphical processing on the display.

The processor of the electronic device may display at least a portion of the information on the ultraviolet reflectance acquired on the basis of the differential image or at least one subject on the display. For example, the processor of the electronic device may display an image on which at least one subject overlaid with ultraviolet radiation distribution is displayed on the display on the basis of the acquired information on the ultraviolet reflectance.

If it is determined that the ultraviolet measurement mode is not executed, the processor of the electronic device may acquire the first image through the light of the first wavelength band in operation 390. In this case, the processor of the electronic device does not acquire the second image. Further, in operation 380, the first image, acquired through the light of the first wavelength band, may be displayed on the display. In the embodiment of operation 390, the user of the electronic device may perform a general selfie operation through the electronic device.

FIG. 3B illustrates ultraviolet radiation information, acquired through an electronic device, displayed on a display according to various embodiments of the disclosure.

According to various embodiments of the disclosure, an electronic device 300 (for example, the electronic device 101 or 201) may include at least one camera 302 (for example, the camera module 291), a display 301 (for example, the display 160 or 260), and a processor (not shown) (for example, the processor 120 or 210).

The processor of the electronic device 300 may display content 305 related to the ultraviolet index or content 306 related to ultraviolet radiation distribution on the display 301. In order to acquire the information that is the source of the content 305 related to the ultraviolet index or the content 306 related to the ultraviolet radiation distribution, the processor of the electronic device 300 may compare the first image including the light of the first wavelength band and the second image including the light of the second wavelength band. For example, the processor of the electronic device 300 may acquire ultraviolet radiation information included in the first image by performing an operation of subtracting the second image from the first image. Further, the processor of the electronic device 300 may acquire a differential image between the first image and the second image through the first image and the second image and acquire ultraviolet radiation information using the acquired differential image.

The processor of the electronic device 300 may acquire ultraviolet radiation information on the basis of the result of comparison between the first image and the second image. The acquired ultraviolet radiation information may include ultraviolet index information indicating the amount of ultraviolet rays or the intensity of the ultraviolet rays at the location at which the first image or the second image is captured. Further, the acquired ultraviolet radiation information may include ultraviolet radiation distribution information corresponding to at least one subject included in the first image or the second image.

Referring to the content 305 related to the ultraviolet index of FIG. 3B, it will be noted that the amount of ultraviolet rays is large or the intensity of ultraviolet rays is strong at the location at which the first image or the second image is captured. Further, referring to the content 306 related to the ultraviolet radiation distribution of FIG. 3B, ultraviolet radiation distribution information 307 corresponding to at least one subject 308 included in the first image or the second image may be acquired. The ultraviolet radiation distribution information 307 corresponding to at least one subject 308 may be expressed using different chromas of a color. For example, as the color of the ultraviolet radiation information 307 laid over at least one subject 308 is darker, the intensity of ultraviolet rays radiated to the corresponding area is stronger.

Figure 4A:
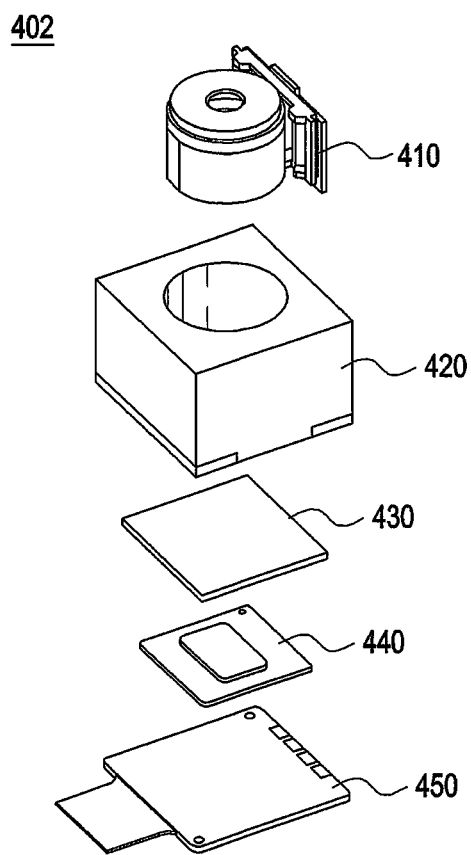
FIGS. 4A and 4B illustrate a camera module of the electronic device according to various embodiments of the disclosure.
Figure 4B:
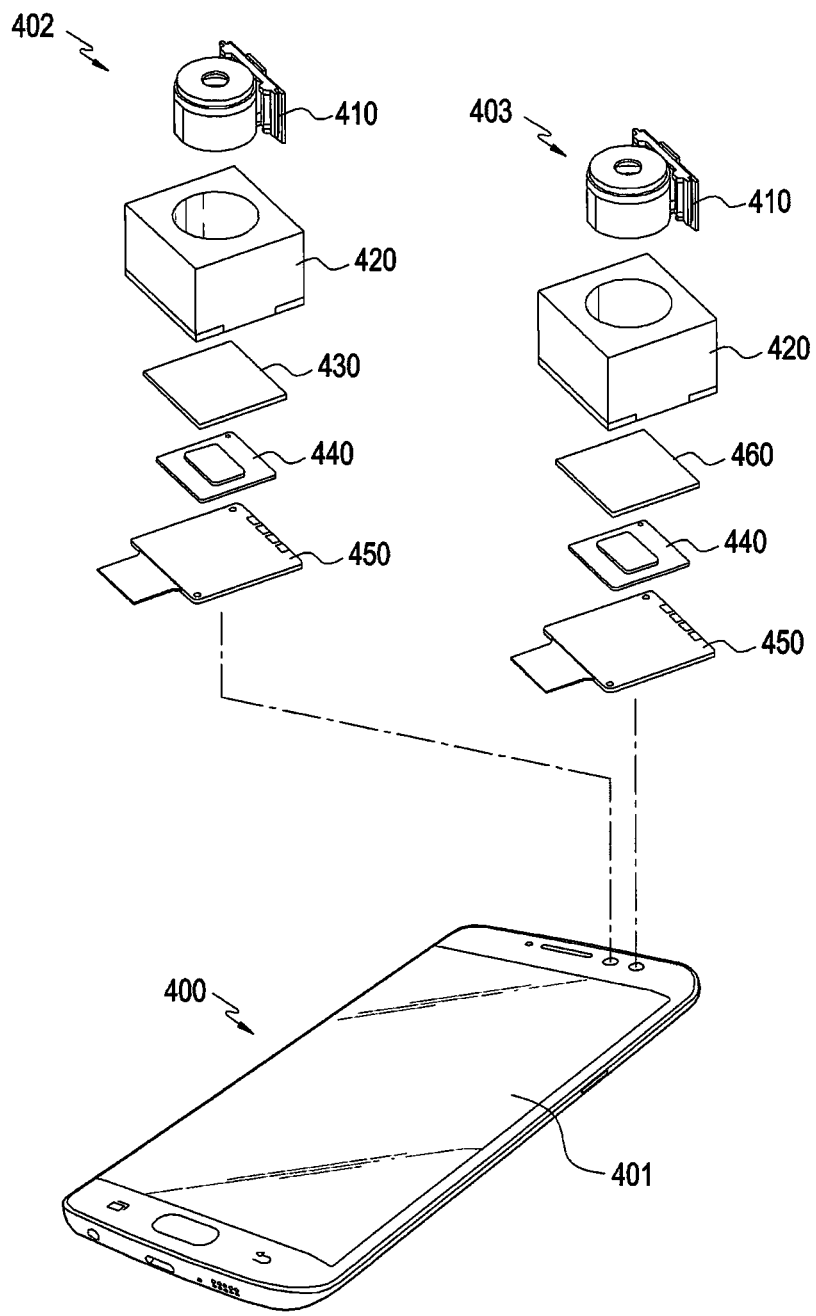

FIGS. 4A and 4B illustrate a camera module of the electronic device according to various embodiments of the disclosure.

FIG. 4A schematically illustrates a camera of the electronic device according to various embodiments of the disclosure. A camera 402 (for example, the camera module 291) of the electronic device may include at least one of a lens 410, an actuator 420, a filter 430 for blocking light of a specific wavelength band, an image sensor 440, and an image signal processor 450.

The lens 410 may serve to refract at least one source of light incident on the camera. The lens 410 may include a convex lens, but this is only an example, and it will be easily understood by those skilled in the art that there is no limitation thereon as long as light is capable of penetrating therethrough.

The actuator 420 may perform an operation of moving at least one device included in the camera 402. For example, the actuator 420 may perform an automatic focusing function on light incident through the lens 410 through an operation of moving an optic axis of the camera 402.

The filter 430 for blocking light of the specific wavelength band may be disposed on the front surface of the image sensor 440. The filter 430 may block light of at least some wavelengths among light of various wavelength bands incident on the image sensor 440. For example, the filter 430 may block the light of the ultraviolet band, among the light of the ultraviolet band, the visible light band, and the infrared band. The processor of the electronic device may activate the filter 430 in order to prevent light of a specific band from being transferred to the image sensor 440. The light of at least some of the wavelengths incident through the lens 410 may be blocked by the activated filter 430. In this case, the image sensor 440 of the camera 402 may receive only light from which some wavelengths are removed, among the light of various wavelengths incident through the lens 410.

The image sensor 440 is an image-recording device including a Charge-Coupled Device (CCD) or a Complementary Metal-Oxide Semiconductor (CMOS), and the processor of the electronic device may acquire an image on the basis of at least one source of light received by the image sensor 440.

The image signal processor 450 may be a processor performing improvement of image quality, calibration, conversion, analysis, and synthesis on at least one image acquired through the image sensor 440. It has been described that the image signal processor 450 is functionally and structurally distinguished from the processor of the electronic device, but this is only an example, and it may be easily understood by those skilled in the art that the image signal processor 450 operates as the processor (for example, the processor 120 or 210) of the electronic device or a portion of the processor (for example, the processor 120 or 210) of the electronic device.

FIG. 4B illustrates an electronic device including a dual camera according to various embodiments of the disclosure.

According to an embodiment, an electronic device 400 (for example, the electronic device 101 or 201) may include a display 401 (for example, the display 160 or 260) and at least one camera 402 or 403 (for example, the camera module 291).

A first camera 402 of the electronic device 400 may include at least one of a lens 410, an actuator 420, a filter 430 for blocking light of a specific wavelength band, an image sensor 440, and an image signal processor 450. A second camera 403 of the electronic device 400 may include at least one of a lens 410, an actuator 420, a filter 460 for blocking light of a specific wavelength band, an image sensor 440, and an image signal processor 450. The filter 430 included in the first camera 402 and the filter 460 included in the second camera 403 may block light of different wavelength bands.

For example, the processor of the electronic device 400 may acquire the first image including the light of the first wavelength band through the first camera 402. Further, the processor of the electronic device 400 may acquire the second image including the light of the second wavelength band through the second camera 403. The first wavelength band may be a band including all of the ultraviolet band, the visible light band, and the infrared band. The second wavelength band may be a band including wavelengths of at least one of the visible light band and the infrared band.

The processor of the electronic device 400 may perform image pickup on the same subject simultaneously using light of different wavelengths through the first camera 402 and the second camera 403.

Figure 5A:
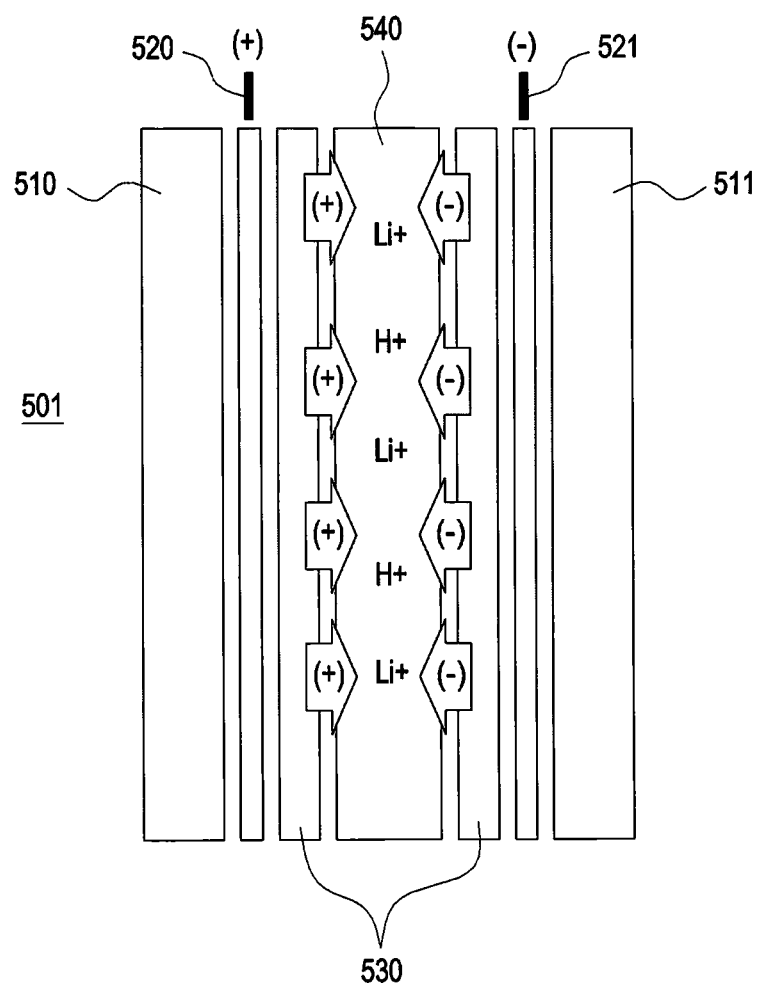
FIGS. 5A and 5B illustrate a cell-type filter for blocking light of a specific wavelength band according to various embodiments of the disclosure.
Figure 5B:
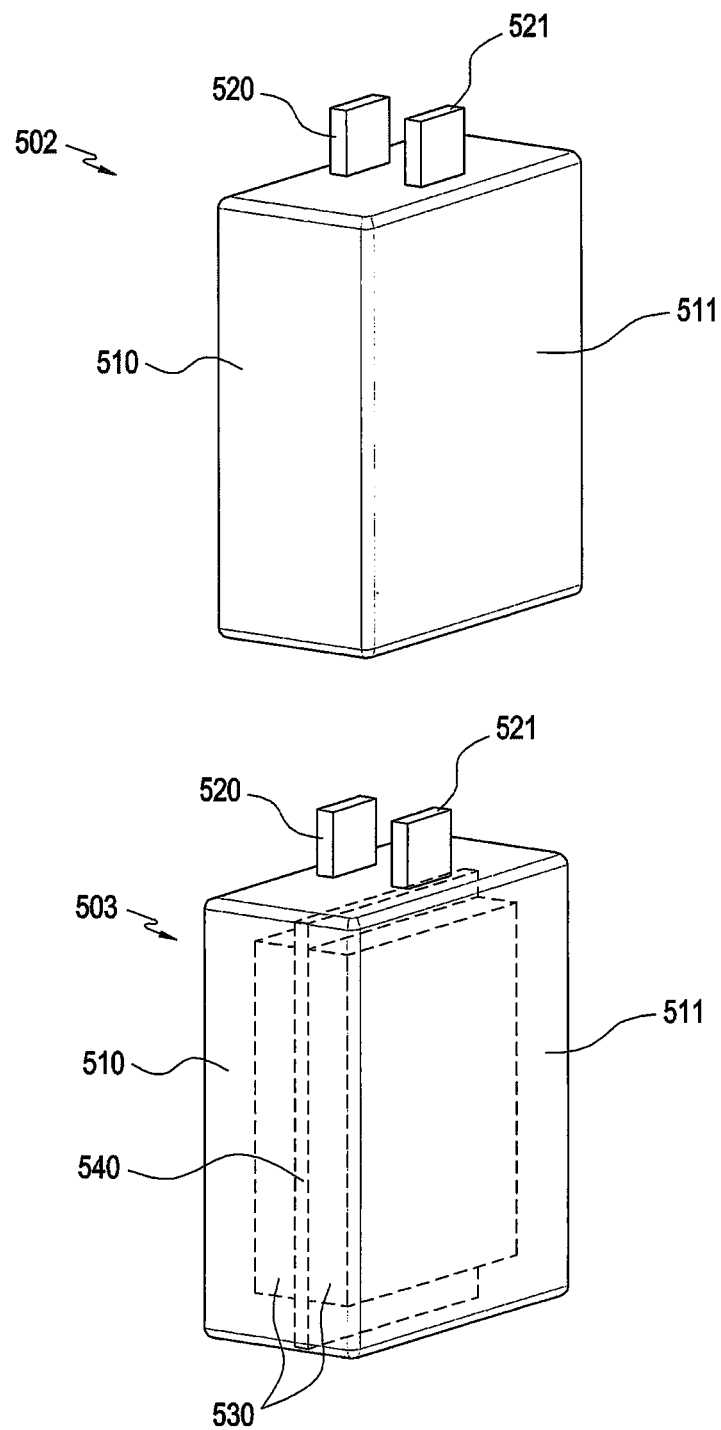

FIGS. 5A and 5B illustrate a cell-type filter for blocking light of a specific wavelength band according to various embodiments of the disclosure.

According to an embodiment, the camera (for example, the camera module 291) of the electronic device may include at least one of a lens (for example, the lens 410), an actuator (for example, the actuator 420), a filter (for example, the filter 501, 502, or 503), an image sensor (for example, the image sensor 440), and an image signal processor (for example, the image signal processor 450).

FIG. 5A is a cross-sectional view of the filter 501 and FIG. 5B illustrates the appearance of the filter 502 and a perspective view of the filter 503.

The filters 501, 502, and 503 may be configured in the form of an electrochemical cell including transparent windows 510 and 511, transparent electrodes 520 and 521, an electrochromic material 530, and an electrolyte 540. The filter 501, 502, or 503 may have a structure in which an anode and a cathode, each of which consists of three layers, facing each other with the electrolyte 540 therebetween. For example, the transparent window 510 may be coupled to a first side of the transparent anode 520. The second side of the transparent anode 520 may be coated with the electrochromic material 530. Similarly, the transparent window 511 may be coupled to the first side of the transparent cathode 521. The second side of the transparent cathode 521 may be coated with the electrochromic material 530. In other words, the filters 501, 502, and 503 may be configured in the form of an electrochemical cell in which three layers, consisting of the transparent windows 510 and 511, the transparent electrodes 520 and 521, and the electrochromic material 530, face each other with the electrolyte 540 therebetween.

The transparent windows 510 and 511 are elements surrounding the external surfaces of the filters 501, 502, and 503 and may be glass, transparent plastic, or transparent films.

The transparent electrodes 520 and 521 may include conductive oxide. For example, the transparent electrodes 520 and 521 may include at least one of indium-tin oxide (ITO), zinc oxide (ZnO), tin oxide ($SnO_2$), titanium dioxide ($TiO_2$), Ga-doped ZnO (GZO), Al-doped ZnO (AZO), silver nanowire, carbon nanotubes (SWCNT, MWCNT), graphene, and conductive polymer (polyacetylene, polypyrrole, polythiophene, polyphenylene vinylene, and polyphenylene). The transparent electrodes 520 and 521 may be manufactured through vacuum deposition such as sputtering, Chemical Vapor Deposition (CVD), or Physical Vapor Deposition (PVD) or a method of inkjet printing, spraying, gravure, or slot die coating. The transparent electrodes 520 and 521 have specific resistance of $10^4$/cm or smaller and sheet resistance of $10^4$/sq or smaller and allow light of all wavelengths to pass therethrough. Particularly, the transparent electrodes 520 and 521 may be configured to have a penetration ratio of 75% or higher in a visible light region in order to acquire a clear image through a camera.

"Electrochromic" means that a material color varies in a reversible manner depending on an electrochemical oxidation or reduction reaction when a voltage is applied. For example, the electrochromic material 530 may be characterized in that it has a transparent color before the voltage is applied and a specific color according to the oxidation or reduction reaction after the voltage is applied. Alternatively, the electrochromic material may be characterized in that it has a specific color before the voltage is applied and a transparent color according to the oxidation or reduction reaction after the voltage is applied. The electrochromic material 530 may include an inorganic electrochromic material such as a tungsten oxide ($WO_3$), niobium oxide ($Nb_2O_5$), molybdenum oxide ($MoO_3$), titanium dioxide ($TiO_3$), vanadium oxide ($V_2O_5$), iridium oxide ($IrO_2$), or nickel oxide (NiO), or an organic electrochromic material (poly 3-methylthiophene, PEDOT, N-methyl-PProDOP, or Polythiophene). Meanwhile, methods of coating the electrochromic material 530 on the transparent electrodes 520 and 521 may include vacuum deposition, such as sputtering, Chemical Vapor Deposition (CVD), or Physical Vapor Deposition (PVD) or a method of sol-gel synthesis, inkjet printing, spray, gravure, or slot die coating.

The electrolyte 540 may be located between the anode 520 and the cathode 521 and may be used as a path through which ions move. The movement of icons through the electrolyte 540 may cause an electrochemical reaction between the anode 520 and the cathode 521. The electrolyte 540 is a liquid electrolyte, and may include propylene carbonate including lithium cobalt oxide ($LiCoO_4$), poly (epichlorohydrin-co-ethylene oxide) elastomer, and PEPI-EO. Further, the electrolyte 540 is a solid electrolyte, and may include lithium sulfide ($Li_2S$—$P_2S_5$—$Li_3PO_4$ or $Li_2S$—$P_2S_5$), lithium nitride ($Li_3N$), lithium lanthanum titanate ($Li_{0.5}La_{0.5}TiO_3$), or lithium lanthanum tantalum oxide ($Li_5La_3Ta_2O_{12}$).

According to an embodiment, the processor of the electronic device may deactivate a filter to allow the light of the first wavelength band including all of the ultraviolet band, the visible light band, and the infrared band to pass therethrough. To this end, the electronic device may not apply the voltage to the filters 501, 502, and 503 of the camera. The light of the first wavelength band may pass through the filters 501, 502, and 503, that is, filters having a transparent color. The image sensor of the camera may acquire the first image including the light of the first wavelength band, having passed through the filters 501, 502, and 503 to which the voltage is not applied.

The processor of the electronic device may activate a filter to allow the light of the second wavelength band including the wavelength of at least one of the visible light band and the infrared band to pass therethrough. The activated filters 501, 502, and 503 may include the electrochromic material 530 capable of blocking the light of the ultraviolet band. To this end, the electronic device may apply the voltage to the filters 501, 502, and 503 of the camera module. The filters 501, 502, and 503, that is, filters having a color capable of blocking the light of the ultraviolet band can pass through only the light of the second wavelength band from which the light of the ultraviolet band is removed. The image sensor of the camera may acquire the second image including the light of the second wavelength band having passed through the filters 501, 502, and 503 to which the voltage is applied.

For example, the filters 501, 502, and 503 may include the electrochromic material 530 capable of blocking the light of the ultraviolet band (or allowing only the light of the ultraviolet band to pass therethrough). When the voltage is applied to the electrochromic material 530 included in the filters 501, 502, and 503, lithium (Li) ions enter the electrochromic material 530, and accordingly the electrochromic material 530 is discolored. Since the discolored electrochromic material 530 is able to block the light of the ultraviolet band (or allow only the light of the ultraviolet band to pass therethrough), only the light from which the light of the ultraviolet band is removed (or the light of the ultraviolet band) may pass through the filters 501, 502, and 503 and be transferred to the image sensor.

The electrochromic material 530 may be coated on only one of the anode 520 and the cathode 521 or on both the anode 520 and the cathode 521. When the electrochromic material 530 is coated on only one of the anode 520 and the cathode 521, the electrode on which the electrochromic material 530 is not coated may include the transparent window and only two layers of the transparent electrode.

When the electrochromic material 530 is coated on both the anode 520 and the cathode 521, the electrochromic material capable of blocking the light of the ultraviolet band may be coated on one electrode among the anode 520 and the cathode 521, and electrochromic material capable of blocking the light of the infrared band may be coated on the other electrode. In this case, depending on the polarity of the power applied to the filters 501, 502, and 503, only the light from which the light of the infrared band or the ultraviolet band is blocked may pass through the filters 501, 502, and 503 and be transferred to the image sensor.

A chemical reaction formula of an electrochromic process may be expressed below.

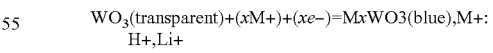

Tungsten oxide (WO3), which is one of the electrochromic materials, may react with a hydrogen ion or a lithium ion that induces discoloration and may be discolored from a transparent color to blue.

Figure 6A:
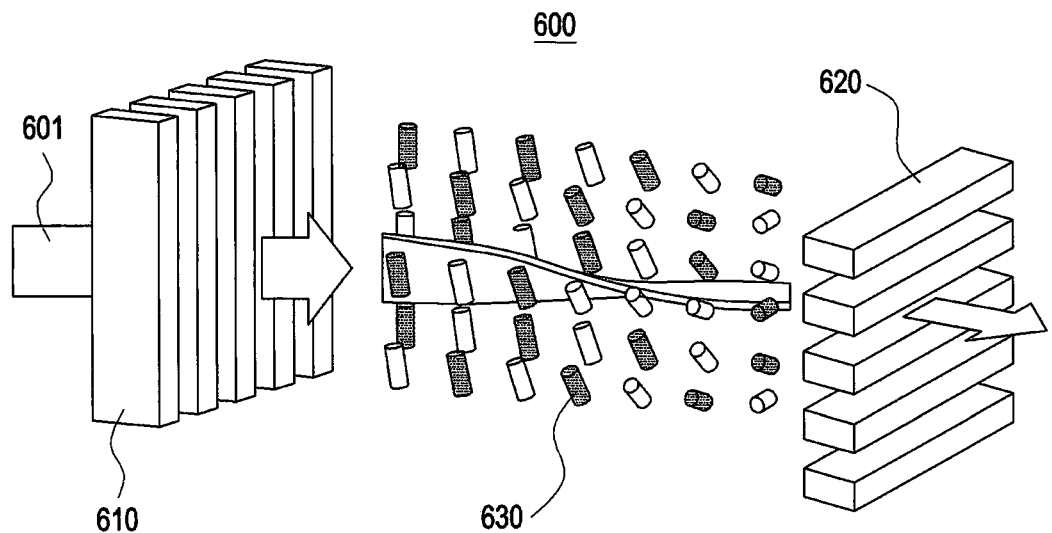
FIGS. 6A and 6B illustrate a polarized-light-type filter for blocking light of a specific wavelength band according to various embodiments of the disclosure.
Figure 6B:
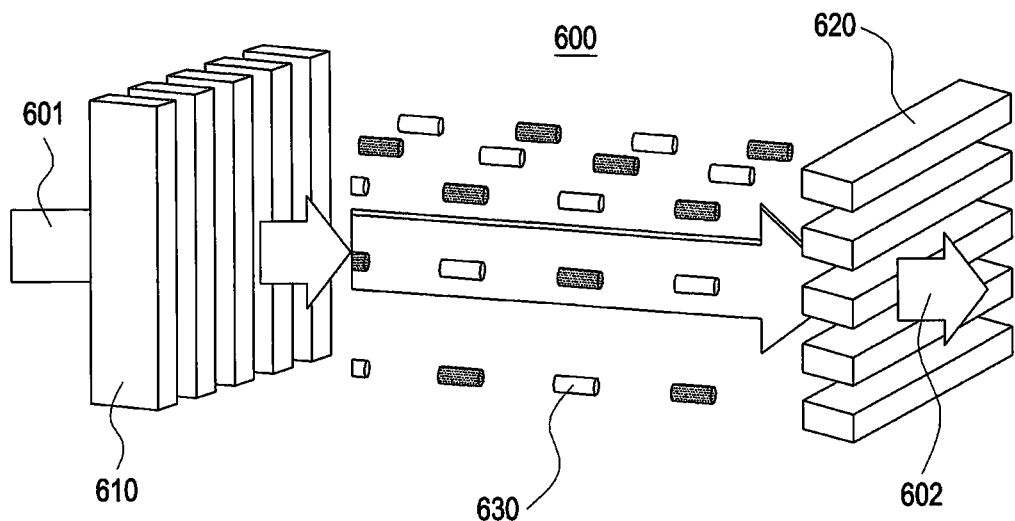

FIGS. 6A and 6B illustrate a polarized-light-type filter for blocking light of a specific wavelength according to various embodiments of the disclosure.

According to an embodiment, the camera (for example, the camera module 291) of the electronic device may include at least one of a lens (for example, the lens 410), an actuator (for example, the actuator 420), a filter 600, an image sensor (for example, the image sensor 440), and an image signal processor (for example, the image signal processor 450).

The filter 600 may include two polarizing plates which configure the external surfaces of the filter 600 and a liquid crystal disposed between the two polarizing plates. For example, the filter 600 may include a first polarizing plate 610 disposed on a first surface in a first direction on the external surfaces of the filter 600 and a second polarizing plate 620 having a polarizing axis orthogonal to the polarizing axis of the first polarizing plate 610 and disposed on a second surface in a second direction opposite the first direction on the external surfaces of the filter 600. Further, the filter 600 may include the liquid crystal 630 inside the filter 600.

The first polarizing plate 610 may include a plurality of plates disposed at regular intervals. The plurality of plates included in the first polarizing plate 610 may be formed of polyvinyl alcohol (PVA), polyethylene terephthalate (PET), polycarbonate (PC), polymethyl methacrylate (PMMA), polyether sulfone (PES), ethylene vinyl acetate (EVA), or glass. A metal material for blocking the penetration of light may be coated on outer surfaces of the plurality of plates included in the first polarizing plate 610. At least one of Ti, Pd, Pt, Al, CU, SI, Au, and Fe may be used as the metal material that can be coated on the outer surfaces of the plurality of plates. Since the metal material for blocking the penetration of light is coated on the outer surfaces of the plurality of plates included in the first polarizing plate 610, light 601 incident on the filter 600 may include only a component that vibrates in a vertical direction while passing through the first polarizing plate 610.

The second polarizing plate 620 may include a plurality of plates disposed at regular intervals. The plurality of plates included in the second polarizing plate 620 may be formed of polyvinyl alcohol (PVA), polyethylene terephthalate (PET), polycarbonate (PC), polymethyl methacrylate (PMMA), polyether sulfone (PES), ethylene vinyl acetate (EVA), or glass. An ultraviolet-blocking material for blocking the penetration of light of the ultraviolet band or an ultraviolet-penetrating material for admitting only the light of the ultraviolet band may be applied on the outer surfaces of the plurality of plates included in the second polarizing plate 620. For example, the ultraviolet-blocking material that can be applied on the outer surfaces of the plurality of plates may include a physical blocking material such as zinc oxide, titanium oxide, iron oxide, or magnesium oxide, having a physical property of reflecting and dispersing the ultraviolet rays from the ultraviolet-blocking material, and a chemical blocking material such as PABA derivatives, cinnamate derivatives, salicylic acid derivatives, benzophenone, or anthranilate, having a property of absorbing ultraviolet rays.

The liquid crystal 630 is a material having a characteristic in which the molecular arrangement thereof varies depending on the voltage applied thereto, and may be located between the first polarizing plate 610 and the second polarizing plate 620. The direction of radiation of the light incident through the first polarizing plate 610 may be changed according to the state of arrangement of a plurality of molecules included in the liquid crystal 630.

The processor of the electronic device may change the direction of radiation of the light incident through the first polarizing plate 610 by applying the voltage to the liquid crystal 630. For example, referring to FIG. 6A, the light 601 incident on the filter 600 may include only a component that vibrates in a vertical direction while passing through the first polarizing plate 610. The processor of the electronic device may control the arrangement of the plurality of molecules included in the liquid crystal 630 so as to gradually twist 90 degrees in the direction from the first polarizing plate 610 to the second polarizing plate 620 by applying the voltage to the liquid crystal 630. The light 601 including only the component that passes through the first polarizing plate 610 and vibrates in the vertical direction may twist a vibration direction by 90 degrees while passing through the plurality of molecules included in the liquid crystal 630. As a result, the light 601 passing through the liquid crystal 630 may include only the component that vibrates in the vertical direction. The light 601 including only the component that vibrates in the vertical direction may pass through the second polarizing plate 620 including the plurality of plates disposed in a horizontal direction without any loss.

According to the embodiment of FIG. 6A, the processor of the electronic device may prevent the light 601 passing through the first polarizing plate 610 from being blocked by the second polarizing plate 620 by changing the direction of radiation of the light 601 incident on the filter 600 through the application of the voltage to the liquid crystal 630. For example, the processor of the electronic device may control the liquid crystal 630 of the filter 600 in order to admit the light 601 of the first wavelength band including all of the wavelengths of the ultraviolet band, the visible light band, and the infrared band. The electronic device may apply a first voltage to the filter 600 of the camera. When the first voltage is applied to the filter 600, the arrangement of the plurality of molecules included in the liquid crystal 630 is changed and thus the direction of radiation of the light 601 incident through the first polarizing plate 610 may be changed. When the first voltage is applied to the filter 600, the arrangement of the plurality of molecules included in the liquid crystal 630 is gradually twisted by 90 degrees in the direction from the first polarizing plate 610 to the second polarizing plate 620, and thus the direction of radiation of the light 601 incident through the first polarizing plate 610 may also be twisted by 90 degrees. The light 601 of which the progress direction is twisted by 90 degrees may pass through the second polarizing plate 620 including the plurality of plates disposed in the horizontal direction. As a result, all of the light 601 of the first wavelength band may pass through the filter 600 to which the first voltage is applied. The image sensor of the camera may acquire the first image including the light 601 of the first wavelength band passing through the filter 600 to which the first voltage is applied.

According to the embodiment of FIG. 6B, the processor of the electronic device may enable at least a portion of the light 601 passing through the first polarizing plate 610 to be blocked by the second polarizing plate 620 by maintaining the direction of radiation of the light 601 incident on the filter 600 through the application of the voltage to the liquid crystal 630. For example, the processor of the electronic device may control the liquid crystal 630 of the filter 600 in order to allow only light 602 of the second wavelength band, including the wavelength of at least one of the visible light band and the ultraviolet band, to pass therethrough, among the light 601 of the first wavelength band including all of the wavelengths of the infrared band, the visible light band, and the ultraviolet band. The electronic device may apply a second voltage to the filter 600 of the camera. When the second voltage is applied to the filter 600, the arrangement of the plurality of molecules included in the liquid crystal 630 may be changed to be parallel to the direction from the first polarizing plate 610 to the second polarizing plate 620, and thus the direction of radiation of the light 601 incident through the first polarizing plate 610 may not be changed. A portion of the light 601 of which the progress direction is not changed may be blocked by the second polarizing plate 620, including the plurality of plates disposed in the horizontal direction. For example, since the plurality of plates included in the second polarizing plate 620 is coated with an ultraviolet-blocking material, the light of the ultraviolet band, among the light 601 of the first wavelength band, including all of the wavelengths of the ultraviolet band, the visible light band, and the infrared band, may be blocked by the second polarizing plate 620. As a result, the light of the ultraviolet band, among the light 601 of the first wavelength band, cannot pass through the filter 600 to which the second voltage is applied, and only the light 602 of the second wavelength band can pass through the filter 600 to which the second voltage is applied. The image sensor of the camera may acquire the second image including the light 602 of the second wavelength band passing through the filter 600 to which the second voltage is applied.

Figure 7A:
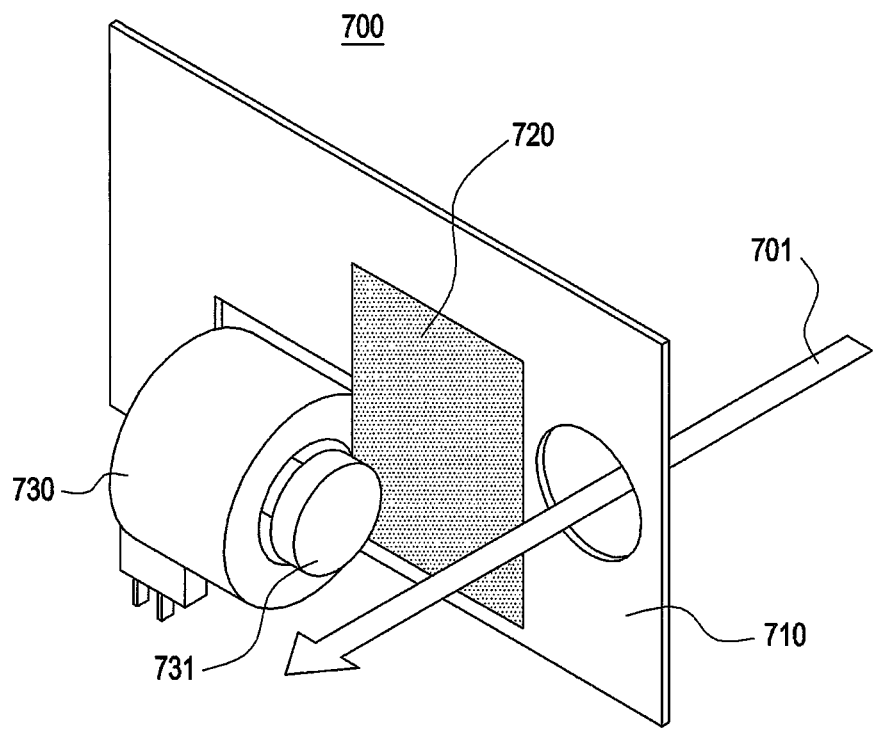
FIGS. 7A and 7B illustrate an actuator-type filter for blocking light of a specific wavelength band according to various embodiments of the disclosure.
Figure 7B:
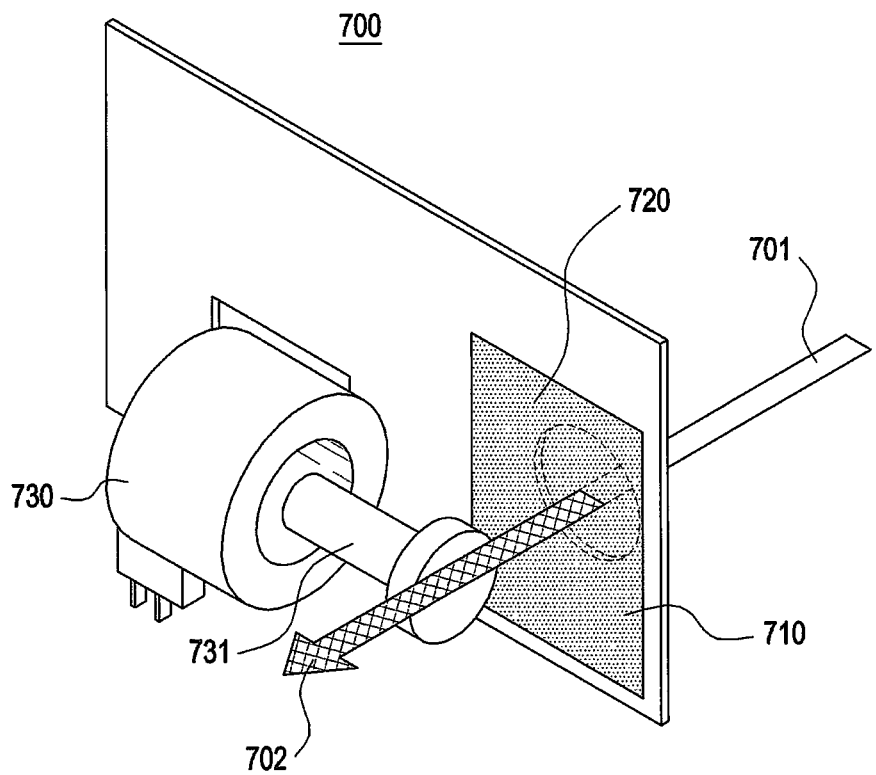

FIGS. 7A and 7B illustrate an actuator-type filter for blocking light of a specific wavelength band according to various embodiments of the disclosure.

According to an embodiment, a camera (for example, the camera module 291) of the electronic device may include at least one of a lens (for example, the lens 410), a first actuator (for example, the actuator 420), a filter 700, an image sensor (for example, the image sensor 440), and an image signal processor (for example, the image signal processor 450).

The filter 700 may include a flat plate 710 including a hole through which light 701 incident on the filter 700 passes, a blocking plate 720 for blocking light of at least some bands of the first wavelength, and second actuators 730 and 731 for moving the blocking plate in order to open/close the hole formed in the flat plate 710.

The flat plate 710 may include at least one hole through which the light 701 incident on the filter 700 can pass.

The blocking plate 720 may have, for example, a characteristic of blocking the light of the ultraviolet band but allowing the light of the infrared band or the visible light band to pass therethrough. The blocking plate 720 may be manufactured by coating an ultraviolet-blocking material on a transparent window. The transparent window may be made of glass, but this only an example, and it will be readily understood by those skilled in the art that there is no limitation as to the material therefor, as long as the material is transparent and allows light to pass therethrough, such as transparent plastic and transparent film. Meanwhile, methods of coating the ultraviolet-blocking material on the transparent window may include vacuum deposition such as sputtering, Chemical Vapor Deposition (CVD), or Physical Vapor Deposition (PVD), or a method of sol-gel synthesis, spin coating, doctor blade, extrusion, dip coating, spraying, or electrodeposition. The ultraviolet-blocking material used for coating the transparent window includes a physical blocking material such as zinc oxide, titanium oxide, iron oxide, or magnesium oxide having a physical property of reflecting and dispersing the ultraviolet rays from the ultraviolet-blocking material and a chemical blocking material such as PABA derivatives, cinnamate derivatives, salicylic acid derivatives, benzophenone, or anthranilate having a property of absorbing ultraviolet rays.

The second actuators 730 and 731 may be driving modules for performing an operation of opening/closing at least one hole formed in the flat plate 710 using the blocking plate 720. For example, the second actuators may include a cylindrical magnetic bobbin 730 around which a coil is wound and a guide 731 capable of moving inside the magnetic bobbin 730. The guide 731 must move inside the cylinder around which the coil is wound and thus may be formed of a material that reacts to a magnetic field. Accordingly, the guide 731 may be formed of a paramagnetic material that is influenced by a magnetic field. The guide 731 may be connected to the blocking plate 720, and accordingly the blocking plate 720 may move in accordance with the movement of the guide 731. The processor of the electronic device may control the movement of the guide 731 by applying an induced current to the coil surrounding the magnetic bobbin 730.

According to the embodiment of FIG. 7A, the processor of the electronic device may control the second actuators 730 and 731 of the filter 700 in order to allow the light 701 of the first wavelength band, including all of the wavelengths of the ultraviolet band, the visible light band, and the infrared band, to pass therethrough. The processor of the electronic device may apply the first voltage to the coil surrounding the magnetic bobbin 730 in order to prevent at least one hole formed in the flat plate 710 from being hidden by the blocking plate 720. According to the applied first voltage, a first induced current flows into the coil surrounding the bobbin 730, and the guide 731 may move to the inside of the magnetic bobbin 730 in response to the first induced current. As a result, all of the light 701 of the first wavelength band may pass through the filter 700. The image sensor of the camera may acquire the first image including the light 701 of the first wavelength band passing through the filter 700.

According to the embodiment of FIG. 7B, the processor of the electronic device may control the second actuators 730 and 731 of the filter 700 in order to allow only the light 702 of the second wavelength band, including the wavelength of at least one of the visible light band and the infrared band, to pass therethrough among the light 701 of the first wavelength band including all of the wavelengths of the ultraviolet band, the visible light band, and the infrared band. The processor of the electronic device may apply the second voltage to the coil surrounding the magnetic bobbin 730 in order to hide at least one hole, formed in the flat plate 710, by the blocking plate 720. According to the applied second voltage, a second induced current flows into the coil surrounding the magnetic bobbin 730, and the guide 731 may move to the outside of the magnetic bobbin 730 in response to the second induced current. The blocking plate 720 connected to the guide 731 may close at least one hole formed in the flat plate 710 in response to movement of guide 731 to the outside of the magnetic bobbin 730. As a result, the light of the ultraviolet band, among the light 701 of the first wavelength band, cannot pass through the blocking plate 720, and only the light 702 of the second wavelength band can pass through the blocking plate 720. The image sensor of the camera may acquire the second image including the light 702 of the second wavelength band passing through the blocking plate 720.

Figure 8A:
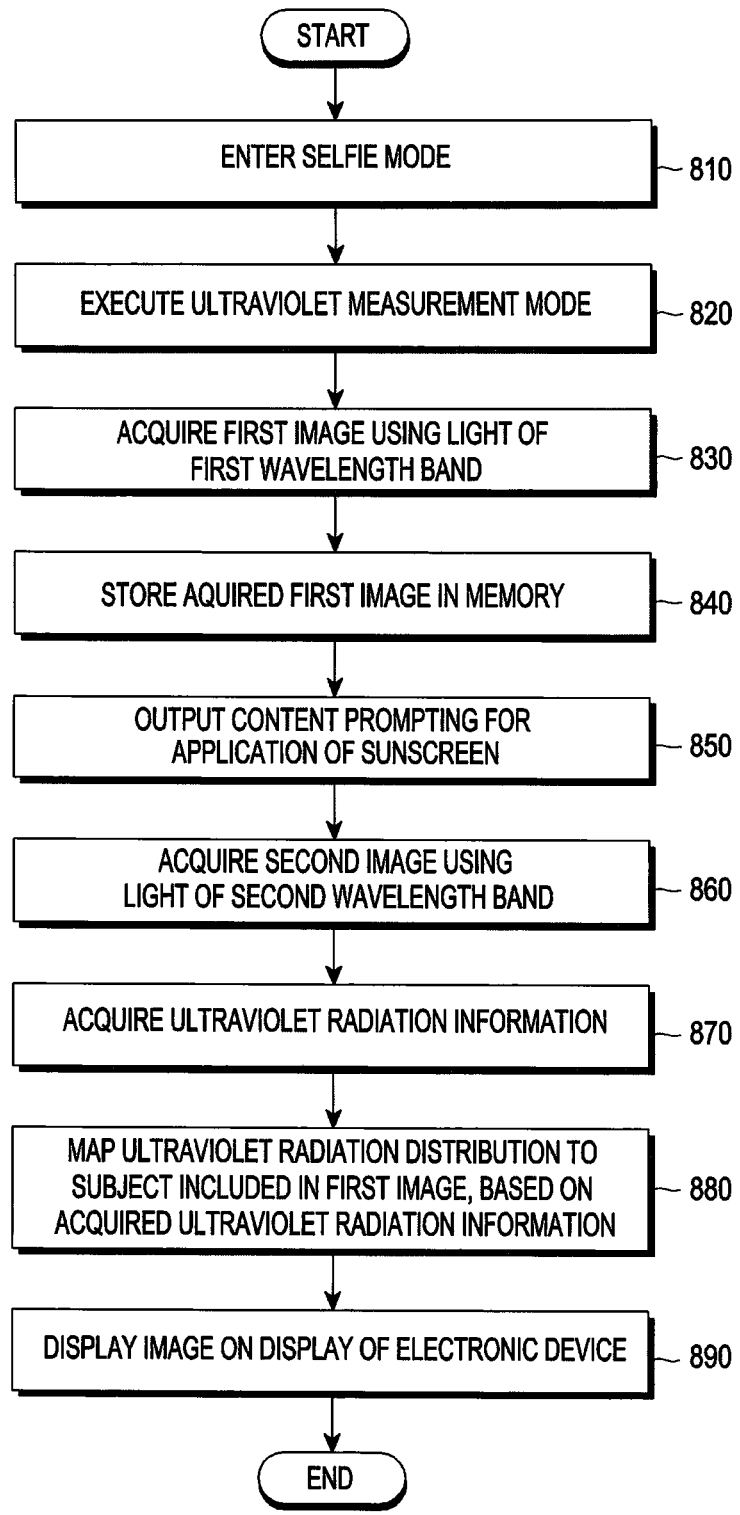
FIGS. 8A to 8C are diagrams related to the acquisition of ultraviolet radiation information through an electronic device according to various embodiments of the disclosure.
Figure 8B:
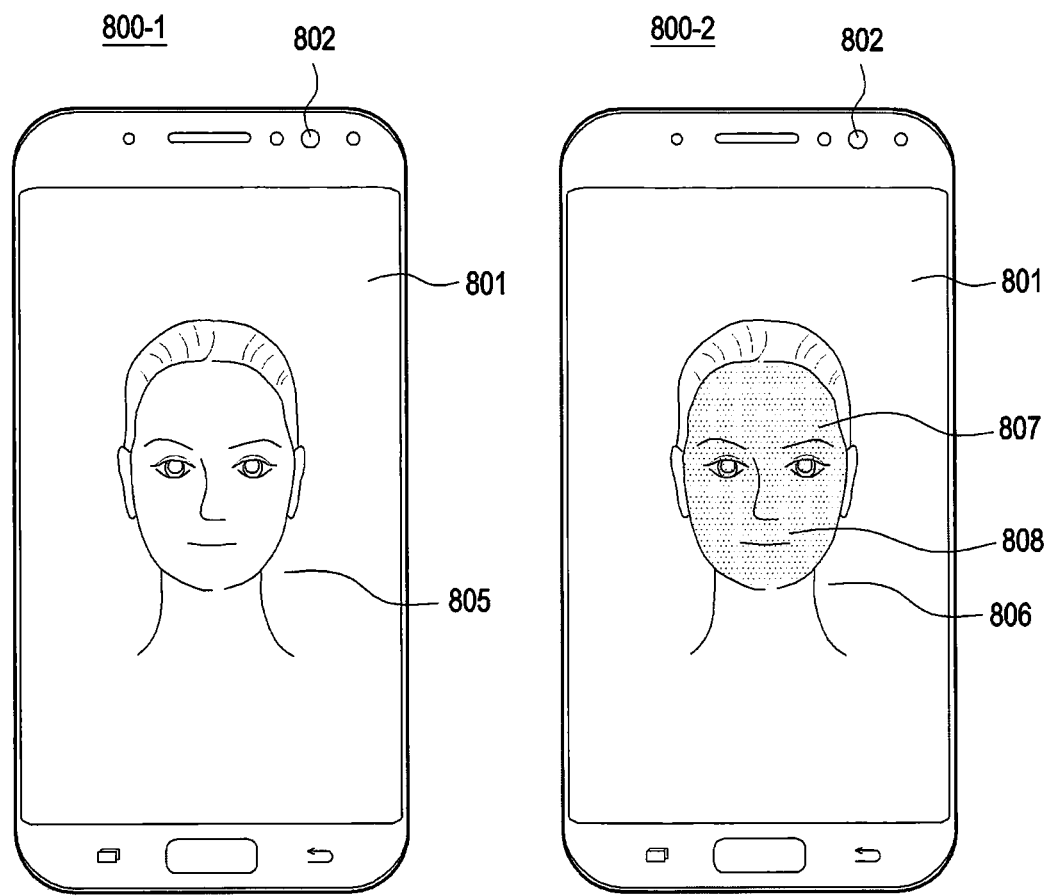
Figure 8C:
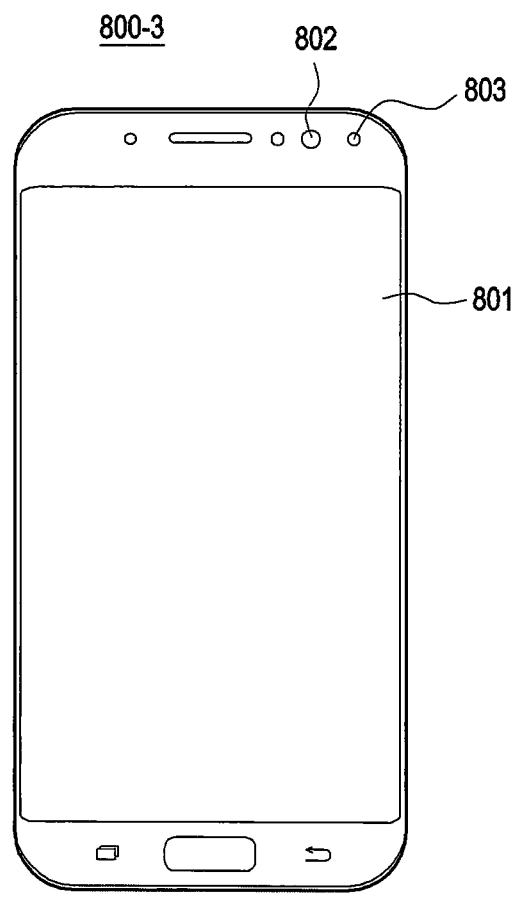

FIGS. 8A to 8C are diagrams related to acquisition of ultraviolet radiation information through an electronic device according to various embodiments of the disclosure.

FIG. 8A is a flowchart illustrating a method of acquiring ultraviolet radiation information through an electronic device.

In operation 810, the processor of the electronic device may determine whether a signal related to execution of a selfie mode is received. When the signal related to the execution of the selfie mode is received, the processor of the electronic device may activate the camera of the electronic device. The processor of the electronic device may acquire at least one image through the activated camera and display a preview image corresponding to the acquired image through a display. The processor, having verified entry into the selfie mode, may perform operation 820.

In operation 820, the processor of the electronic device may determine whether a signal related to execution of an ultraviolet measurement mode is received. When a signal related to execution of the ultraviolet measurement mode is received, the processor of the electronic device may perform operation 830.

In operation 830, the processor of the electronic device may acquire a first image including a first subject through light of a first wavelength band. For example, the first subject included in the first image may be a face of the user of the electronic device. The processor of the electronic device may acquire the first image including the light of the first wavelength band through at least one camera included in the electronic device. The first wavelength band may be a band including all of the ultraviolet band, the visible light band, and the infrared band. Accordingly, the first image acquired through the light of the first wavelength band may be an image acquired through a general camera. The processor of the electronic device may control a filter of the camera to allow an image sensor of the electronic device to receive the light of the first wavelength band incident on a lens of the camera. For example, the filter of the camera may be deactivated in order to prevent the light of the first wavelength band from being blocked by the filter of the camera.

In operation 840, the processor of the electronic device may store the acquired first image in a memory (for example, the memory 130 or 230) of the electronic device. The memory of the electronic device in which the first image is stored may include volatile and/or nonvolatile memory.

In operation 850, the processor of the electronic device may output content prompting for application of sunscreen. For example, a notification prompting for application of sunscreen may be displayed through a display of the electronic device. The user of the electronic device may apply sunscreen on his/her face with reference to the content displayed through the display.

Further, the processor of the electronic device may output content prompting for application of sunscreen in response to a signal received from the outside. For example, when the user of the electronic device enters the selfie mode and then executes settings related to application of sunscreen, the processor of the electronic device may output content prompting for application of sunscreen in operation 850.

In operation 860, the processor of the electronic device may acquire a second image including a first subject through light of a second wavelength band. For example, the first subject included in the second image may be a face of the user of the electronic device. The processor of the electronic device may acquire the second image including the light of the second wavelength band through at least one camera included in the electronic device. The second wavelength band may be an ultraviolet band. Accordingly, the second image acquired using the light of the second wavelength band may include ultraviolet radiation information.

Meanwhile, the second image may include a subject wearing sunscreen. The subject wearing sunscreen may have ultraviolet reflectance higher than a subject not wearing sunscreen. Further, even for the subject wearing sunscreen, an area on which the sunscreen has been thoroughly applied may have relatively higher ultraviolet reflectance and an area on which the sunscreen has not been thoroughly applied may have relatively low ultraviolet reflectance. Accordingly, the processor of the electronic device may identify that the area having the high ultraviolet reflectance is an area in which ultraviolet protection is sufficient.

In operation 870, the processor of the electronic device may acquire ultraviolet radiation information through the first image stored in the memory and the acquired second image. For example, the processor of the electronic device may acquire ultraviolet radiation information of the first subject included in the first image and the second image.

The acquired ultraviolet radiation information may include ultraviolet index information indicating the amount of ultraviolet rays or the intensity of the ultraviolet rays at the location at which the first image or the second image is captured. Further, the acquired ultraviolet radiation information may include ultraviolet radiation distribution information of the first subject included in the first image or the second image.

Since the second image includes the first subject, on whom the sunscreen is applied, the processor of the electronic device may acquire ultraviolet radiation distribution information from the first subject, on whom the sunscreen is applied. The processor of the electronic device may identify the state in which the sunscreen is applied from the first subject wearing sunscreen.

The processor of the electronic device may acquire ultraviolet radiation information on the basis of data pre-stored in the memory (for example, the memory 130 or 230) of the electronic device or data received from the outside through a communication unit (for example, the communication interface 170 or the communication module 230) of the electronic device.

For example, the processor of the electronic device may acquire ultraviolet radiation information on the basis of user information (for example, information about the user's body or the user's state of health) input in advance by the user of the electronic device. More specifically, the processor of the electronic device may acquire ultraviolet radiation information on the basis of data received from a health management application (for example, S-Health™).

For example, the processor of the electronic device may acquire ultraviolet radiation information on the basis of medical information on the user of the electronic device (for example, medical records and medicine that the user has taken). More specifically, the processor of the electronic device may acquire ultraviolet radiation information on the basis of medical information pre-stored in the memory of the electronic device or medical information received from the outside through the communication unit of the electronic device. The medical information related to the user of the electronic device may include genetic information of the user. The processor of the electronic device may identify whether the user's skin is strongly or weakly resistant to ultraviolet rays through the genetic information of the user. The processor of the electronic device may acquire ultraviolet radiation information on the basis of the information identified through the genetic information of the user.

For example, after identifying the location of the electronic device, the processor of the electronic device may identify at least one piece of environmental information (for example, weather, ozone concentration, and ultraviolet index) corresponding to the location of the electronic device. The processor of the electronic device may acquire ultraviolet radiation information on the basis of at least one piece of identified environmental information.

For example, the processor of the electronic device may identify the skin tone or skin state of the user of the electronic device using at least one of the images stored in the memory of the electronic device and acquire ultraviolet radiation information on the basis of the identification result.

For example, the processor of the electronic device may acquire ultraviolet radiation information on the basis of predetermined information pre-stored in the memory of the electronic device or predetermined information received from the outside through communication by the electronic device. More specifically, the processor of the electronic device may acquire predetermined information on the user of the electronic device through various methods. The processor of the electronic device may acquire outdoor activity information of the user from the predetermined information on the user. The processor of the electronic device may identify a time at which the possibility of exposure to ultraviolet rays is high on the basis of the acquired outdoor activity information through outdoor activities of the user of the electronic device. When the selfie operation is performed at a time at which the possibility of exposure to ultraviolet rays is high, the processor of the electronic device may execute the ultraviolet measurement mode of operation 820. Further, when it is determined that the possibility of exposure to ultraviolet rays is high on the basis of the acquired outdoor activity information through outdoor activities of the user of the electronic device, the processor of the electronic device may output a notification prompting for application of the sunscreen.

For example, the processor of the electronic device may compare the first image, acquired using the light of the first wavelength band, with the second image, acquired using the light of the second wavelength band, and may identify the state of the first subject commonly included in the first image and the second image. More specifically, the first subject included in the first image may be a subject on which no sunscreen is applied, and the first subject included in the second image may be a subject on which the sunscreen is applied. The processor of the electronic device may compare the first image with the second image and identify the state of application of the sunscreen on the first subject commonly included in the first image and the second image. The processor of the electronic device identifying the state of application of the sunscreen on the first subject may receive information on the sunscreen applied on the first subject from the outside. According to an embodiment, the processor of the electronic device may acquire information on the sunscreen applied on the first subject from the user of the electronic device. The processor of the electronic device may store the information on the sunscreen received from the outside in the memory of the electronic device. The processor of the electronic device may monitor the skin state of the user of the electronic device on the basis of the ultraviolet radiation information acquired through the various embodiments and the information on the sunscreen stored in the memory. The processor of the electronic device may monitor the skin state of the user through a health management application (for example, S-Health™).

In operation 880, the processor of the electronic device may map ultraviolet radiation distribution to the subject included in the first image on the basis of the acquired ultraviolet radiation information. For example, the processor of the electronic device may map ultraviolet radiation distribution to the first subject included in the first image on the basis of ultraviolet radiation distribution information included in the ultraviolet radiation information. Further, the processor of the electronic device may identify information on ultraviolet radiation that influences the first subject included in the first image and generate an image related to the identified ultraviolet radiation distribution.

In operation 890, the processor of the electronic device may display the image related to the ultraviolet radiation distribution on the display. For example, the processor of the electronic device may additionally perform graphical processing, such as color, brightness, and chroma processing, on the image to which the ultraviolet radiation distribution is mapped. The processor of the electronic device may display the image having undergone the graphical processing on the display.

FIG. 8B illustrates an electronic device for displaying an image to which ultraviolet radiation distribution is mapped.

An electronic device 800-1 or 800-2 (for example, the electronic device 101 or 201) may include a display 801 (for example, the display 160 or 260) and at least one camera 802 (for example, the camera module 291).

An image displayed on the display 801 of the electronic device 800-1 is a first image 805 acquired using the light of the first wavelength band including all of the wavelengths of the ultraviolet band, the visible light band, and the infrared band. The first image 805 may include at least one subject.

The processor of the electronic device may acquire a second image through the light of the second wavelength band including the wavelength of the ultraviolet band and acquire ultraviolet radiation information from the second image. The processor of the electronic device may map ultraviolet radiation distribution to the subject included in the first image 805 on the basis of ultraviolet radiation distribution information included in the acquired ultraviolet radiation information. Further, the processor of the electronic device may identify information on ultraviolet radiation that influences the subject included in the first image 805 and generate an image related to the identified ultraviolet radiation distribution.

An image displayed on the display 801 of the electronic device 800-2 is a third image 806 in which ultraviolet radiation distribution is mapped to the subject included in the first image 805. The third image 806 may include ultraviolet radiation distribution information of the subject. For example, a dark area 807 in the third image 806 may be an area having low ultraviolet reflectance. A bright area 808 in the third image 806 may be an area having high ultraviolet reflectance. The processor of the electronic device may determine that the area having low ultraviolet reflectance is an area in which the state of application of the sunscreen is not satisfactory. Further, the processor of the electronic device may determine that an area having high ultraviolet reflectance is an area in which the state of application of the sunscreen is satisfactory.

According to another embodiment, the camera of the electronic device may include a plurality of filters which can block or admit therethrough light of various bands. In order to selectively receive only the light of a specific band or not to selectively receive only the light of a specific band, the processor of the electronic device may activate at least one of the plurality of filters included in the camera. For example, the processor of the electronic device may activate at least one of the plurality of filters included in the camera in order to block or allow light of at least one of ultraviolet ray A (320 to 380 nm), ultraviolet ray B (280 to 320 nm), and ultraviolet ray C (100 to 280 nm) to pass therethrough.

FIG. 8C illustrates an electronic device including an ultraviolet light source.

An electronic device 800-3 (for example, the electronic device 101 or 201) may include a display 801 (for example, the display 160 or 260), at least one camera 802 (for example, the camera module 291), and an ultraviolet light source 803.

When capturing a subject through the at least one camera 802, the electronic device may radiate an ultraviolet light source onto the subject. For example, when capturing is performed indoors, where no ultraviolet light source such as sunlight exists, the processor of the electronic device may acquire information on ultraviolet radiation that influences at least one subject by radiating light of the ultraviolet band to the subject through the ultraviolet light source 803. The ultraviolet light source 803 may be configured to radiate a wavelength of a long wavelength band, and thus the influence on the subject by the ultraviolet light source 803 may be minimized. The processor of the electronic device may identify whether the sunscreen is uniformly applied on the user's face on the basis of the light of the ultraviolet band radiated through the ultraviolet light source 803.

Figure 9:
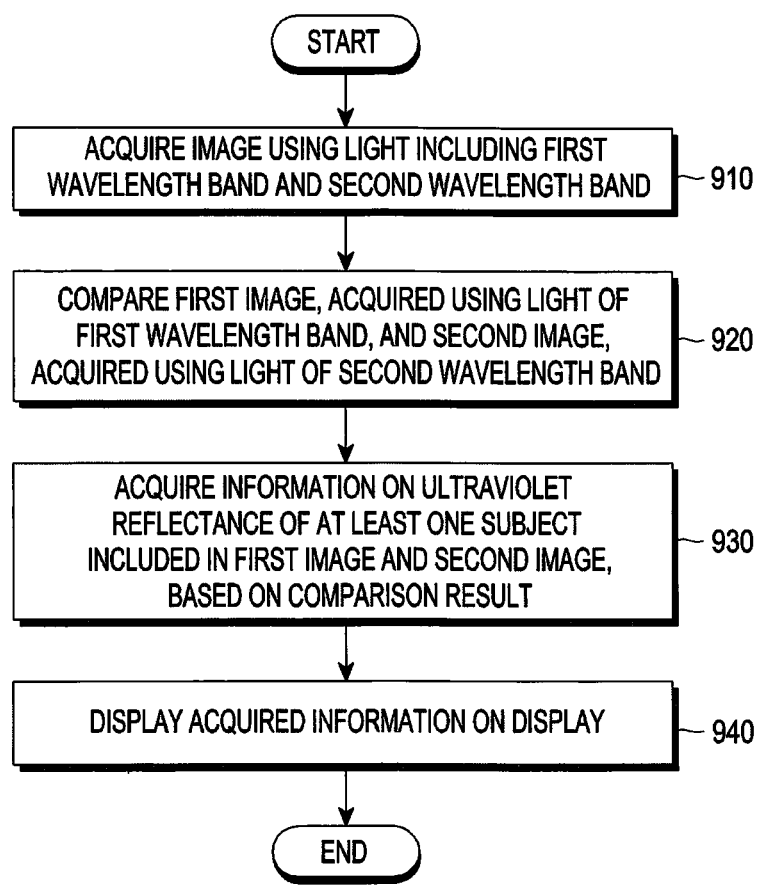
FIG. 9 is a flowchart illustrating a process of acquiring ultraviolet radiation information through an electronic device according to various embodiments of the disclosure.

FIG. 9 is a flowchart illustrating a process of acquiring ultraviolet radiation information through an electronic device according to various embodiments of the disclosure.

In operation 910, the electronic device may acquire an image through light including a first wavelength band and a second wavelength band. For example, the first wavelength band may include all of the ultraviolet band, the visible light band, and the infrared band. The second wavelength band may include at least one of the visible light band and the infrared band, or may include only the ultraviolet band.

In operation 920, the electronic device may compare a first image, acquired using the light of the first wavelength band, with a second image, acquired using light of the second wavelength band. For example, the electronic device may acquire ultraviolet radiation information included in the first image by performing an operation of subtracting the second image from the first image. More specifically, since the first image may be an image acquired on the basis of the light of the ultraviolet band, the visible light band, and the infrared band and the second image is an image acquired on the basis of the light of at least one of the visible light band and the infrared band, the electronic device may acquire ultraviolet radiation information by comparing the first image and the second image. Further, the electronic device may acquire a differential image between the first image and the second image through the first image and the second image and acquire ultraviolet radiation information using the acquired differential image.

In operation 930, the electronic device may acquire information on the ultraviolet reflectance of at least one subject included in the first image and the second image based on the result of the comparison between the first image and the second image.

According to an embodiment, information on ultraviolet reflectance may include the acquired ultraviolet radiation information. The information on ultraviolet reflectance may include information on the value of at least one of a plurality of pixels included in the first image or the second image. The information on the ultraviolet reflectance may include information on relative reflectance between a plurality of pixels included in the first image or the second image. The information on the ultraviolet reflectance may include ultraviolet radiation distribution information of the subject included in the first image or the second image. The information on the ultraviolet reflectance may include an image displaying an ultraviolet radiation distribution state of the subject included in the first image or the second image.

The electronic device may acquire ultraviolet radiation information on the basis of data pre-stored in the memory (for example, the memory 130 or 230) of the electronic device or data received from the outside through the communication unit (for example, the communication interface 170 or the communication module 230) of the electronic device.

For example, the electronic device may acquire ultraviolet radiation information on the basis of information on a user (for example, information on the body of the user or state of health of the user) input in advance by the user of the electronic device. More specifically, the electronic device may acquire ultraviolet radiation information on the basis of data received from a health management application (for example, S-Health™).

For example, the electronic device may acquire ultraviolet radiation information on the basis of medical information related to the user of the electronic device (for example, medical records or medicine that the user has taken). More specifically, the processor of the electronic device may acquire ultraviolet radiation information on the basis of medical information pre-stored in the memory of the electronic device or medical information received from the outside through the communication unit of the electronic device. The medical information related to the user of the electronic device may include genetic information of the user. The electronic device may identify whether the user's skin is weakly or strongly resistant to ultraviolet rays through genetic information. The electronic device may acquire ultraviolet radiation information on the basis of information identified through the genetic information of the user.

For example, after checking the location of the electronic device, the electronic device may identify at least one piece of environmental information (for example, weather, ozone concentration, and ultraviolet index) corresponding to the location of the electronic device. The electronic device may acquire ultraviolet radiation information on the basis of at least one of the identified pieces of environmental information.

For example, the electronic device may identify a skin tone or a skin state of the user of the electronic device using at least one of the images stored in the memory of the electronic device and acquire ultraviolet radiation information on the basis of the identification result.

The acquired ultraviolet radiation information may include ultraviolet index information indicating the amount of ultraviolet rays at the location at which the first image or the second image is captured or the intensity of the ultraviolet rays. Further, the acquired ultraviolet radiation information may include ultraviolet radiation distribution information corresponding to at least one subject included in the first image or the second image.

In operation 940, the electronic device may display the acquired information on the display. For example, the acquired information may include an image showing the ultraviolet radiation distribution state of the subject included in the first image or the second image. The electronic device may display an image on which ultraviolet radiation distribution information overlaps the subject on the display.

A method of acquiring an image through an electronic device including an image sensor according to various embodiments of the disclosure may include an operation of comparing a first image, acquired using light of a first wavelength band, and a second image, acquired using light of a second wavelength band, an operation of acquiring information on ultraviolet reflectance of at least a portion of at least one subject included in the first image or the second image based on the result of the comparison, and an operation of displaying at least some of the acquired information on the ultraviolet reflectance on a display.

In the method of acquiring an image through an electronic device including an image sensor according to various embodiments of the disclosure, the first wavelength may include an infrared band, a visible light band, and an ultraviolet band, and the second wavelength band may include an infrared band or a visible light band.

In the method of acquiring an image through an electronic device including an image sensor according to various embodiments of the disclosure, the comparison operation may include an operation of acquiring the first image through a first image sensor configured to acquire an image using the light of the first wavelength band and an operation of acquiring the second image through a second image sensor configured to acquire an image using the light of the second wavelength band.

In the method of acquiring an image through an electronic device including an image sensor according to various embodiments of the disclosure, the electronic device may further include a filter configured to block light of at least a portion of the first wavelength band, and the method may further include an operation of acquiring the first image using the light of the first wavelength band after deactivating the filter, an operation of storing the acquired first image in a memory of the electronic device, an operation of acquiring the second image using the light of the second wavelength band from which the light of at least a portion of the first wavelength band is blocked after activating the filter, and an operation of comparing the stored first image and the acquired second image.

In the method of acquiring an image through an electronic device including an image sensor according to various embodiments of the disclosure, the filter may include: a transparent member configured to form at least a portion of external surfaces of the filter; a transparent anode and a transparent cathode coated with an electrochromic material, and an electrolyte located inside the filter and between the transparent anode and the transparent cathode.

In the method of acquiring an image through an electronic device including an image sensor according to various embodiments of the disclosure, the filter may include: a first polarizing plate disposed on a first surface in a first direction on the external surfaces of the filter; a second polarizing plate having a polarizing axis orthogonal to a polarizing axis of the first polarizing plate and disposed on a second surface in a second direction opposite the first direction on the external surfaces of the filter; and a liquid crystal disposed between the first polarizing plate and the second polarizing plate.

In the method of acquiring an image through an electronic device including an image sensor according to various embodiments of the disclosure, the filter may include: a blocking plate configured to block the light of at least a portion of the first wavelength band; a flat plate including a hole through which the light of the first wavelength band passes; and an actuator configured to move the blocking plate in order to open/close at least one hole formed in the flat plate.

The method of acquiring an image through an electronic device including an image sensor according to various embodiments of the disclosure may include an operation of acquiring a differential image using the first image and the second image and an operation of acquiring information on the ultraviolet reflectance, based on the acquired differential image.

The method of acquiring an image through an electronic device including an image sensor according to various embodiments of the disclosure may include an operation of displaying the information on the ultraviolet reflectance acquired based on the differential image and at least a portion of the at least one subject.

A computer-readable recording medium having a program recorded on the computer to perform a method of acquiring an image through an electronic device including an image sensor according to various embodiments of the disclosure is provided. The method may include an operation of comparing a first image, acquired using light of a first wavelength band, and a second image, acquired using light of a second wavelength band, an operation of acquiring information on ultraviolet reflectance of at least a portion of at least one subject included in the first image or the second image, based on a result of the comparison, and an operation of displaying at least some of the acquired information on the ultraviolet reflectance on a display.

In the computer-readable recording medium having a program recorded on the computer to perform a method of acquiring an image through an electronic device including an image sensor according to various embodiments of the disclosure, the first wavelength may include an infrared band, a visible light band, and an ultraviolet band, and the second wavelength band may include an infrared band or a visible light band.

Each of the above-described component elements of hardware according to the disclosure may be configured with one or more components, and the names of the corresponding component elements may vary based on the type of electronic device. The electronic device according to various embodiments of the disclosure may include at least one of the aforementioned elements. Some elements may be omitted or other additional elements may be further included in the electronic device. Also, some of the hardware components according to various embodiments may be combined into one entity, which may perform functions identical to those of the relevant components before the combination.

The term "module" as used herein may include a unit consisting of hardware, software, or firmware, and may, for example, be used interchangeably with the term "logic", "logical block", "component", "circuit", or the like. The "module" may be an integrated component, or a minimum unit for performing one or more functions or a part thereof. The "module" may be mechanically or electronically implemented and may include, for example, an Application-Specific Integrated Circuit (ASIC) chip, a Field-Programmable Gate Arrays (FPGA), or a programmable-logic device, which has been known or are to be developed in the future, for performing certain operations.

At least some of devices (e.g., modules or functions thereof) or methods (e.g., operations) according to various embodiments may be implemented by an instruction which is stored a computer-readable storage medium (e.g., the memory 130) in the form of a program module. The instruction, when executed by a processor (e.g., the processor 120), may cause the one or more processors to execute the function corresponding to the instruction.

The computer-readable storage medium may include a hard disk, a floppy disk, a magnetic medium (e.g., a magnetic tape), an Optical Media (e.g., CD-ROM, DVD), a Magneto-Optical Media (e.g., a floptical disk), an inner memory, etc. The instruction may include a code made by a complier or a code that can be executed by an interpreter. The programming module according to the disclosure may include one or more of the aforementioned components or may further include other additional components, or some of the aforementioned components may be omitted. Operations performed by a module, a programming module, or other elements according to various embodiments may be executed sequentially, in parallel, repeatedly, or in a heuristic manner. At least some operations may be executed according to another sequence, may be omitted, or may further include other operations.

Various embodiments disclosed herein are provided merely to easily describe technical details of the disclosure and to help the understanding of the disclosure, and are not intended to limit the scope of the disclosure. Accordingly, the scope of the disclosure should be construed as including all modifications or various other embodiments based on the technical idea of the disclosure.

The invention claimed is:

1. An electronic device comprising:
a display;
an image sensor configured to obtain an image using light of a first wavelength band or light of a second wavelength band; and
a processor, wherein the processor is configured to:
compare a first image obtained using the light of the first wavelength band and a second image obtained using the light of the second wavelength band,
obtain information on ultraviolet reflectance of at least a portion of at least one subject included in the first image or the second image, based on a result of the comparison, and
display at least some of the obtained information on the ultraviolet reflectance using the display.

2. The electronic device of claim 1, wherein the first wavelength band includes an infrared band, a visible light band, and an ultraviolet band, and the second wavelength band includes an infrared band or a visible light band.

3. The electronic device of claim 1, wherein the image sensor comprises:
a first image sensor configured to obtain an image using the light of the first wavelength band; and
a second image sensor configured to obtain an image using the light of the second wavelength band.

4. The electronic device of claim 1, further comprising a filter configured to block light of at least a portion of the first wavelength band, wherein the processor is configured to:
obtain the first image using the light of the first wavelength band after deactivating the filter,
store the obtained first image in a memory of the electronic device,
obtain the second image using the light of the second wavelength band from which the light of at least a portion of the first wavelength band is blocked after activating the filter, and
compare the stored first image and the obtained second image.

5. The electronic device of claim 4, wherein the filter comprises:
a transparent member configured to form at least a portion of external surfaces of the filter;
a transparent anode and a transparent cathode coated with an electrochromic material; and
an electrolyte located inside the filter and between the transparent anode and the transparent cathode.

6. The electronic device of claim 4, wherein the filter comprises:
a first polarizing plate disposed on a first surface in a first direction on external surfaces of the filter;
a second polarizing plate having a polarizing axis orthogonal to a polarizing axis of the first polarizing plate and disposed on a second surface in a second direction opposite the first direction on the external surfaces of the filter; and
a liquid crystal disposed between the first polarizing plate and the second polarizing plate.

7. The electronic device of claim 4, wherein the filter comprises:
a blocking plate configured to block the light of at least a portion of the first wavelength band;
a flat plate comprising at least one hole through which the light of the first wavelength band passes; and
an actuator configured to move the blocking plate in order to open/close the at least one hole formed in the flat plate.

8. The electronic device of claim 1, wherein the processor is configured to:
obtain a differential image using the first image and the second image, and
obtain the information on the ultraviolet reflectance, based on the obtained differential image.

9. The electronic device of claim 8, wherein the processor is configured to display the information on the ultraviolet reflectance obtained based on the differential image or the at least a portion of the at least one subject.

10. A method of obtaining an image through an electronic device comprising an image sensor, the method comprising:
comparing a first image obtained using light of a first wavelength band and a second image obtained using light of a second wavelength band;
obtaining information on ultraviolet reflectance of at least a portion of at least one subject included in the first image or the second image, based on a result of the comparison; and
displaying at least some of the obtained information on the ultraviolet reflectance using a display.

11. The method of claim 10, wherein the first wavelength band includes an infrared band, a visible light band, and an ultraviolet band, and the second wavelength band includes an infrared band or a visible light band.

12. The method of claim 10, wherein the comparing comprises:
obtaining the first image through a first image sensor configured to obtain an image using the light of the first wavelength band; and
obtaining the second image through a second image sensor configured to obtain an image using the light of the second wavelength band.

13. The method of claim 10, wherein the electronic device further comprises a filter configured to block light of at least a portion of the first wavelength band,
the method further comprising:
obtaining the first image using the light of the first wavelength band after deactivating the filter;
storing the obtained first image in a memory of the electronic device;
obtaining the second image using the light of the second wavelength band from which the light of at least a portion of the first wavelength band is blocked after activating the filter; and
comparing the stored first image and the obtained second image.

14. The method of claim 13, wherein the filter comprises:
a transparent member configured to form at least a portion of external surfaces of the filter;

a transparent anode and a transparent cathode coated with an electrochromic material; and an electrolyte located inside the filter and between the transparent anode and the transparent cathode.

15. The method of claim 13, wherein the filter comprises:

a first polarizing plate disposed on a first surface in a first direction on the external surfaces of the filter;

a second polarizing plate having a polarizing axis orthogonal to a polarizing axis of the first polarizing plate and disposed on a second surface in a second direction opposite the first direction on the external surfaces of the filter; and a liquid crystal disposed between the first polarizing plate and the second polarizing plate.

16. The method of claim 13, wherein the filter comprises:

a blocking plate configured to block the light of at least a portion of the first wavelength band;

a flat plate comprising at least one hole through which the light of the first wavelength band passes; and an actuator configured to move the blocking plate in order to open/close the at least one hole formed in the flat plate.

17. The method of claim 13, further comprising:

obtaining a differential image using the first image and the second image; and obtaining the information on the ultraviolet reflectance, based on the obtained differential image.

18. The method of claim 17, further comprising displaying the information on the ultraviolet reflectance obtained based on the differential image or the at least a portion of the at least one subject.

19. A non-transitory computer-readable recording medium having a program recorded on the computer to perform a method of obtaining an image through an electronic device comprising an image sensor, the method comprising:

comparing a first image obtained using light of a first wavelength band and a second image obtained using light of a second wavelength band;

obtaining information on ultraviolet reflectance of at least a portion of at least one subject included in the first image or the second image, based on a result of the comparison; and displaying at least some of the obtained information on the ultraviolet reflectance using a display.

20. The non-transitory computer-readable recording medium of claim 19, wherein the first wavelength band includes an infrared band, a visible light band, and an ultraviolet band, and the second wavelength band includes an infrared band or a visible light band.

* * * * *